(12) United States Patent
Suzumura et al.

(10) Patent No.: US 10,410,946 B2
(45) Date of Patent: Sep. 10, 2019

(54) SEMICONDUCTOR DEVICE

(71) Applicant: Renesas Electronics Corporation, Koutou-ku, Tokyo (JP)

(72) Inventors: Naohito Suzumura, Tokyo (JP); Hideki Aono, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/871,793

(22) Filed: Jan. 15, 2018

(65) Prior Publication Data

US 2018/0277459 A1    Sep. 27, 2018

(30) Foreign Application Priority Data

Mar. 27, 2017  (JP) ................. 2017-061804

(51) Int. Cl.
| | |
|---|---|
| *H01L 29/76* | (2006.01) |
| *H01L 23/367* | (2006.01) |
| *H01L 23/528* | (2006.01) |
| *H01L 23/50* | (2006.01) |
| *H01L 23/522* | (2006.01) |
| *H01L 27/092* | (2006.01) |
| *H01L 21/768* | (2006.01) |

(Continued)

(52) U.S. Cl.
CPC ...... *H01L 23/367* (2013.01); *H01L 21/76895* (2013.01); *H01L 21/823821* (2013.01); *H01L 21/823871* (2013.01); *H01L 23/50* (2013.01); *H01L 23/5226* (2013.01); *H01L 23/5286* (2013.01); *H01L 27/0207* (2013.01); *H01L 27/092* (2013.01); *H01L 27/0924* (2013.01); *H01L 27/11807* (2013.01); *H01L 27/0211* (2013.01); *H01L 2027/11874* (2013.01)

(58) Field of Classification Search
None
See application file for complete search history.

(56) References Cited

U.S. PATENT DOCUMENTS

| | | | |
|---|---|---|---|
| 6,774,440 B1* | 8/2004 | Shibata ............... | H01L 29/1087 257/368 |
| 7,537,978 B2* | 5/2009 | Yagishita ............... | H01L 21/84 438/149 |

(Continued)

FOREIGN PATENT DOCUMENTS

JP    2009-016418 A    1/2009

OTHER PUBLICATIONS

Extended European Search Report issued Nov. 9, 2018, in European Patent Application No. 18153504.8.

*Primary Examiner* — Hung K Vu
(74) *Attorney, Agent, or Firm* — Shapiro, Gabor and Rosenberger, PLLC

(57) ABSTRACT

A semiconductor device with a FINFET, which provides enhanced reliability. The semiconductor device includes a first N channel FET and a second N channel FET which are coupled in series between a wiring for output of a 2-input NAND circuit and a wiring for a second power potential. In plan view, a local wiring is disposed between a first N gate electrode of the first N channel FET and a second N gate electrode of the second N channel FET which extend in a second direction, and crosses a semiconductor layer extending in a first direction and extends in the second direction. The local wiring is coupled to a wiring for heat dissipation.

8 Claims, 17 Drawing Sheets

(51) Int. Cl.
*H01L 21/8238* (2006.01)
*H01L 27/02* (2006.01)
*H01L 27/118* (2006.01)

(56) References Cited

U.S. PATENT DOCUMENTS

| | | | |
|---|---|---|---|
| 7,989,846 B2 | 8/2011 | Furuta | |
| 8,643,116 B2* | 2/2014 | Maeda | H01L 27/0207 |
| | | | 257/369 |
| 2003/0211719 A1* | 11/2003 | Ohayashi | H01L 23/5226 |
| | | | 438/597 |
| 2006/0145347 A1* | 7/2006 | Aida | H01L 23/3677 |
| | | | 257/758 |
| 2006/0238292 A1 | 10/2006 | Beach et al. | |
| 2012/0132964 A1 | 5/2012 | Shima et al. | |
| 2012/0146186 A1* | 6/2012 | Lukaitis | H01L 23/3677 |
| | | | 257/536 |
| 2016/0049395 A1* | 2/2016 | Okagaki | G06F 17/5077 |
| | | | 257/401 |
| 2016/0181174 A1 | 6/2016 | Gambino et al. | |
| 2016/0190138 A1* | 6/2016 | Shimbo | H01L 27/0207 |
| | | | 257/369 |

* cited by examiner

SEMICONDUCTOR DEVICE

CROSS-REFERENCE TO RELATED APPLICATIONS

The disclosure of Japanese Patent Application No. 2017-061804 filed on Mar. 27, 2017 including the specification, drawings and abstract is incorporated herein by reference in its entirety.

BACKGROUND

The present invention relates to semiconductor devices and more particularly to technology useful for a semiconductor device with a FINFET.

In recent years, in the field of LSI (Large Scale Integration) which uses silicon, there has been a growing tendency toward reduction in the size of a MISFET (Metal Insulator Semiconductor Field Effect Transistor) as a constituent element of LSI, particularly in terms of the gate length of a gate electrode. The efforts to reduce the MISFET size have been pursued in accordance with the scaling law. However, as the device generations advance, various problems have emerged and it is difficult to suppress short-channel effects in MISFETs and at the same time, achieve high current driving power. With this background, research and development of new structure devices which replace the existing planar MISFETs are being vigorously promoted.

A FINFET is one of the above new structure devices and a three-dimensional MISFET which is different from planar MISFETs. In the FINFET, a FET is formed over a semiconductor layer in the shape of a thin plate which protrudes from the main surface of a semiconductor substrate, so there is a problem that the heat generated during operation of the FET is hardly transferred to the semiconductor substrate.

For example, Japanese Unexamined Patent Application Publication No. 2009-16418 discloses a technique concerning heat dissipation of FINFETs.

SUMMARY

The present inventors have been striving to enhance the reliability of a semiconductor device with a FINFET. It is known that the semiconductor layer temperature rises due to heat generation during operation of the FINFET and for example, the phenomenon called HCI (Hot Carrier Injection) which causes decline in the reliability of the FET occurs. In addition, there is a concern about an influence of such heat on the wiring coupled to the FET, for example, EM (Electro Migration)

In short, there is a need for enhancement of the reliability of a semiconductor device with a FINFET.

The above and further objects and novel features of the present invention will more fully appear from the following detailed description in this specification and the accompanying drawings.

A main aspect of the present invention which will be disclosed herein is briefly outlined below.

According to one aspect of the present invention, there is provided a semiconductor device which includes a first N channel FET and a second N channel FET which are series-coupled between a wiring for output of a 2-input NAND circuit and a wiring for a second power potential. In plan view, a local wiring is disposed between a first N gate electrode of the first N channel FET and a second N gate electrode G2 of the second N channel FET which extend in a second direction, and crosses a semiconductor layer extending in a first direction and extends in the second direction. The local wiring is coupled to a wiring for heat dissipation.

According to the present invention, the reliability of the semiconductor device is enhanced.

DETAILED DESCRIPTION

Figure 1:
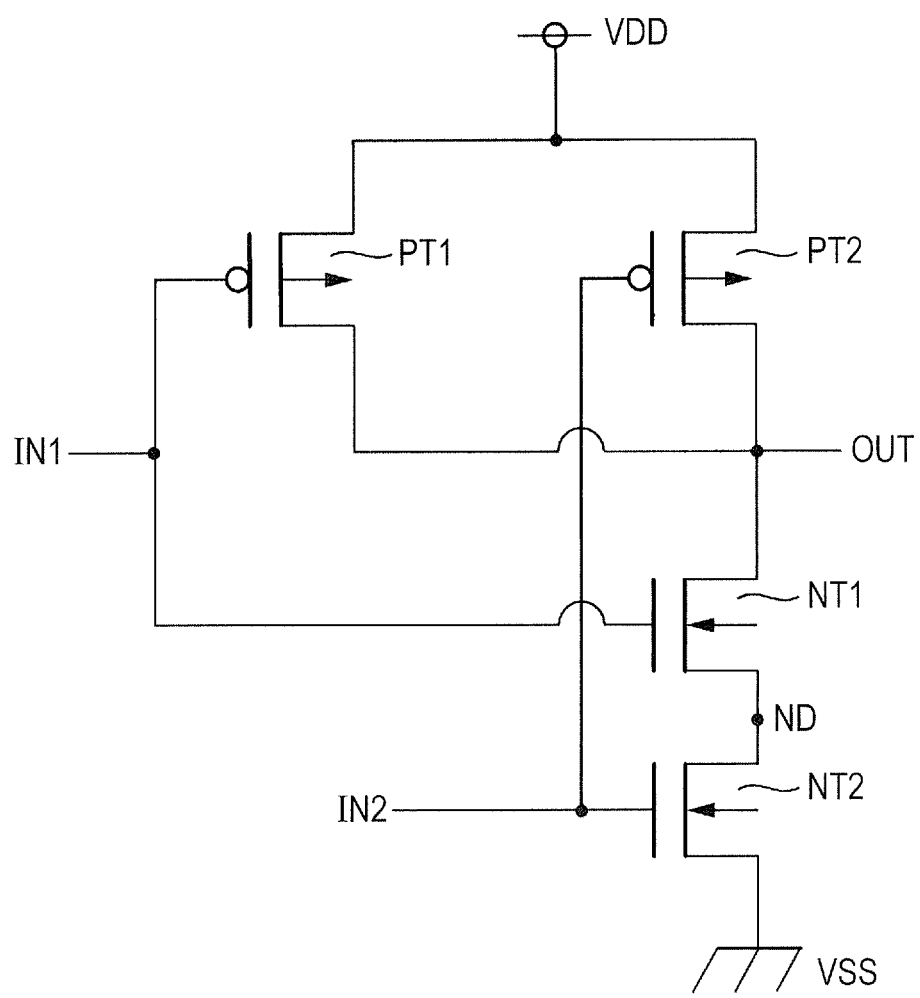
FIG. 1 is an equivalent circuit diagram which shows the configuration of a semiconductor device according to an embodiment of the invention.

The preferred embodiments of the present invention will be described below in different sections or separately as necessary or for the sake of convenience, but the embodiments described as such are not irrelevant to each other unless otherwise stated. One embodiment may be, in whole or in part, a modified, applied, detailed or supplementary form of another. Furthermore, in the preferred embodiments described below, when numerical information for an element (the number of pieces, numerical value, quantity, range, etc.) is given by a specific number, it is not limited to the specific number unless otherwise stated or theoretically limited to the specific number; it may be larger or smaller than the specific number.

In the preferred embodiments described below, constituent elements (including constituent steps) are not necessarily essential unless otherwise stated or theoretically essential. Similarly, in the preferred embodiments described below, when a specific form or positional relation is indicated for an element, it should be interpreted to include a form or positional relation which is substantially approximate or similar to the specific form or positional relation unless otherwise stated or theoretically limited to the specific form or positional relation. The same is true for the above numerical information (the number of pieces, numerical value, quantity, range, etc.).

Next, a preferred embodiment will be described in detail referring to the accompanying drawings. In all the drawings that illustrate the embodiment, members with the same functions are designated by the same or associated reference signs and repeated descriptions thereof are omitted. If a plurality of similar members (parts) are present, in some cases a specific reference sign is added to the generic reference sign for such members to represent an individual or specific part. In the embodiment described below, basically descriptions of the same or similar parts are not repeated except when necessary.

As for the drawings used to illustrate the embodiment, hatching may be omitted even in a sectional view for easy understanding. Also, hatching may be used even in plan view for easy understanding.

In sectional views and plan views, the size of each part may not be proportional to that in an actual device. For easy understanding, a specific part maybe shown as disproportionally large. Even when a plan view corresponds to a sectional view, the size of each part in one view may not be proportional to that in the other view.

In the drawings, it is interpreted that the main surface of each constituent element (for example, a semiconductor substrate) refers to its upper surface, the back surface refers to its lower surface, and the side surface (sidewall) refers to a surface connecting the main surface and the back surface) even if no reference signs for them are shown.

Embodiment

Figure 2:
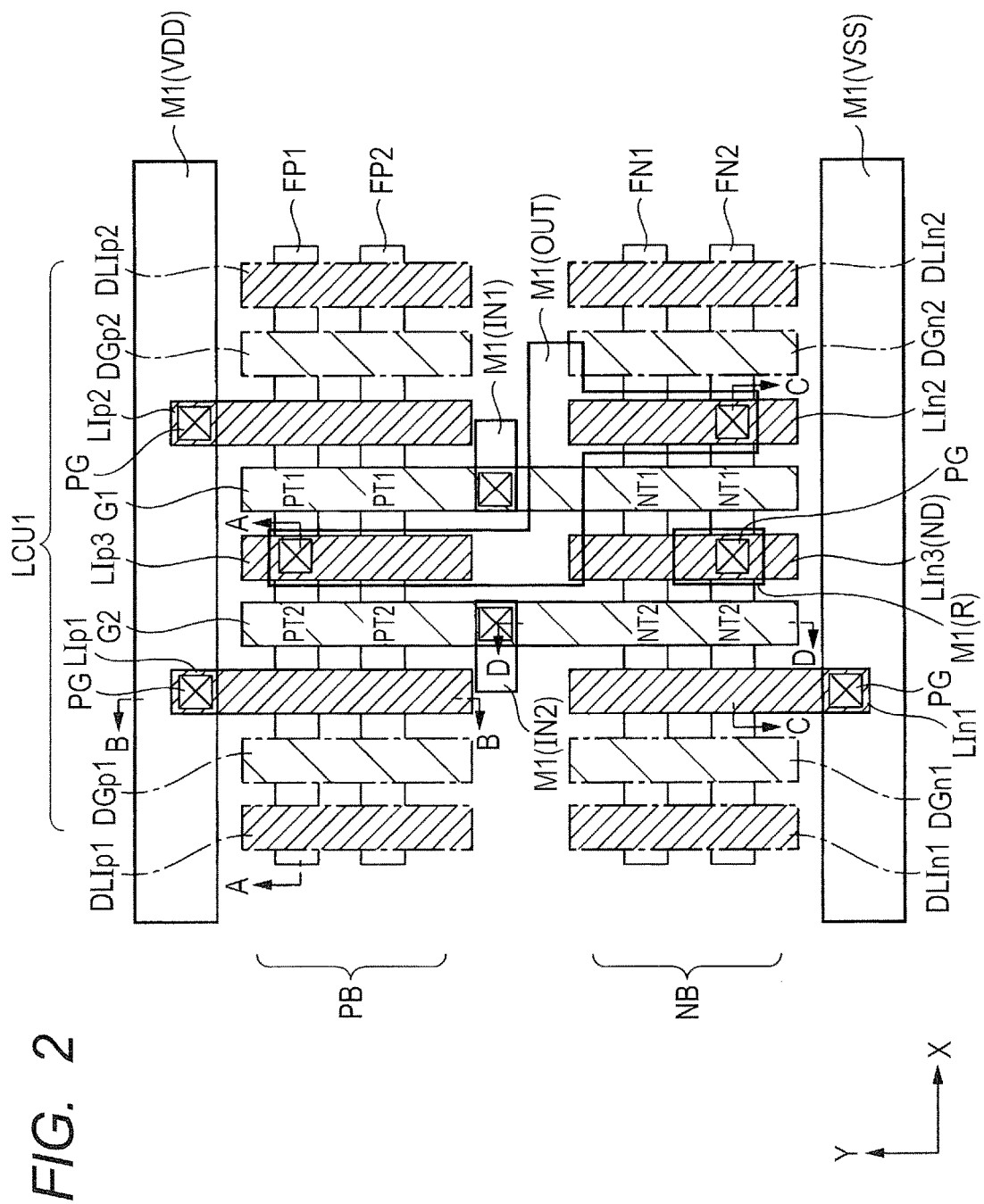
FIG. 2 is a plan view which shows the configuration of the semiconductor device according to the embodiment.
Figure 3:
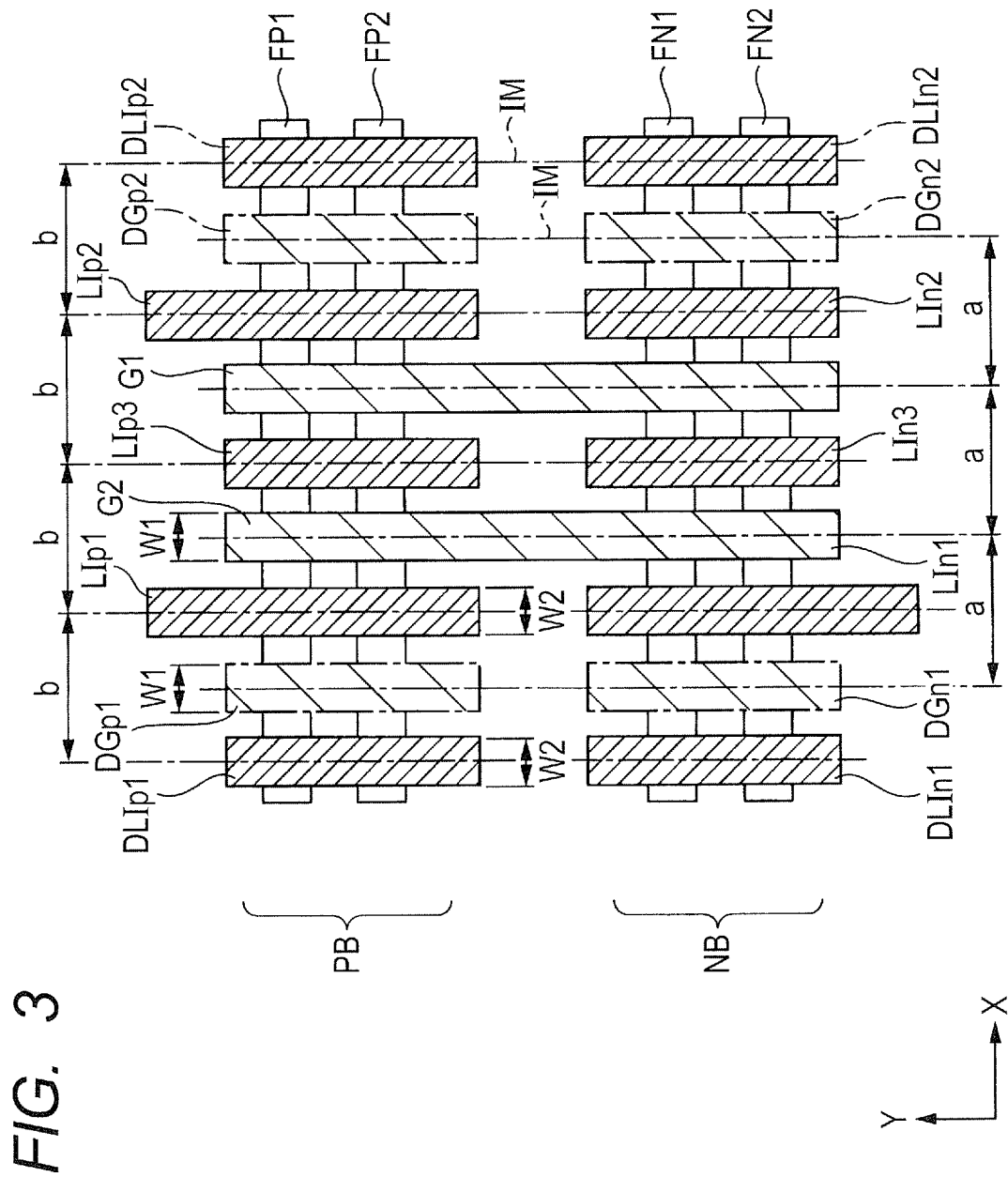
FIG. 3 is a plan view which shows the configuration of the semiconductor device according to the embodiment.
Figure 4:
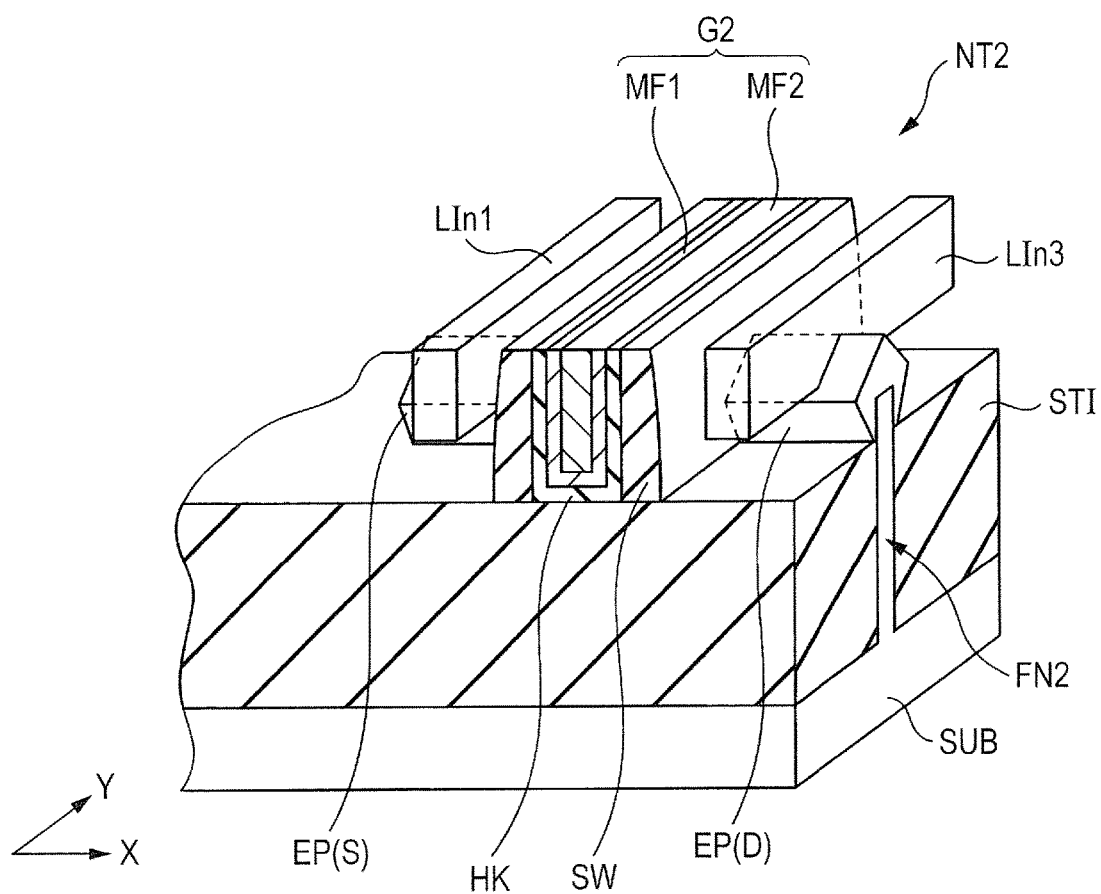
FIG. 4 is a perspective view which schematically shows the configuration of the semiconductor device according to the embodiment.
Figure 5:
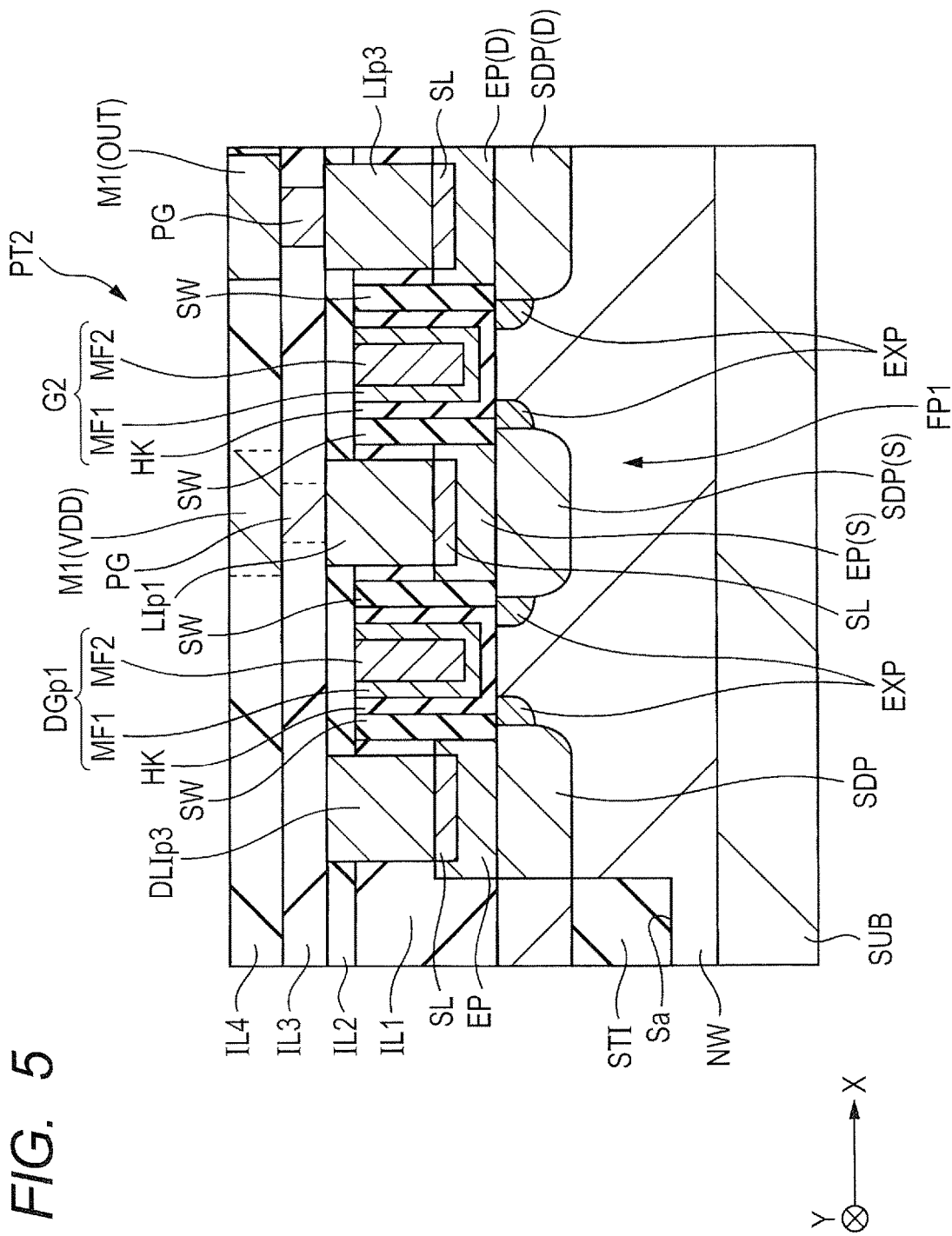
FIG. 5 is a sectional view taken along the line A-A of FIG. 2.
Figure 6:
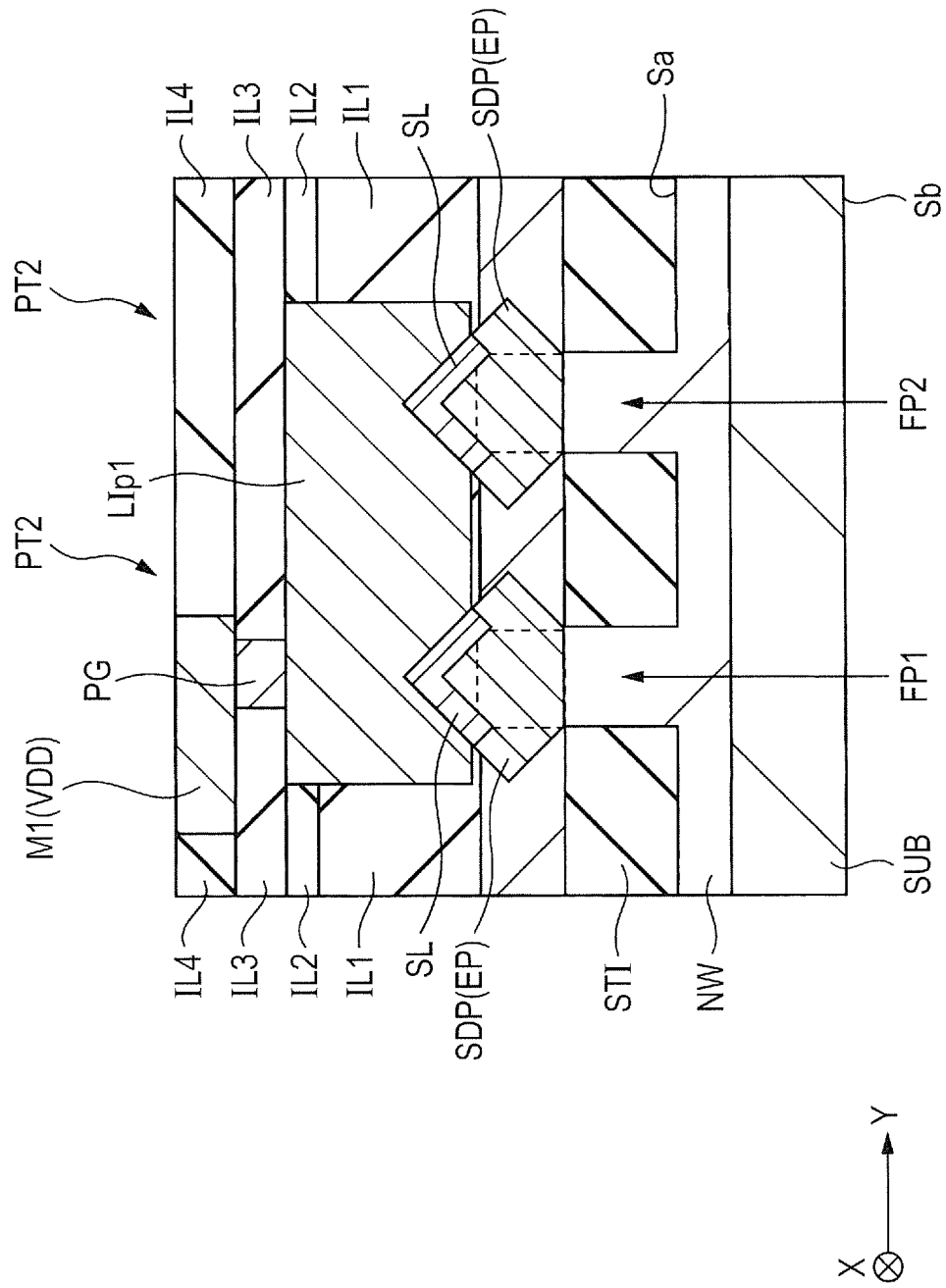
FIG. 6 is a sectional view taken along the line B-B of FIG. 2.
Figure 7:
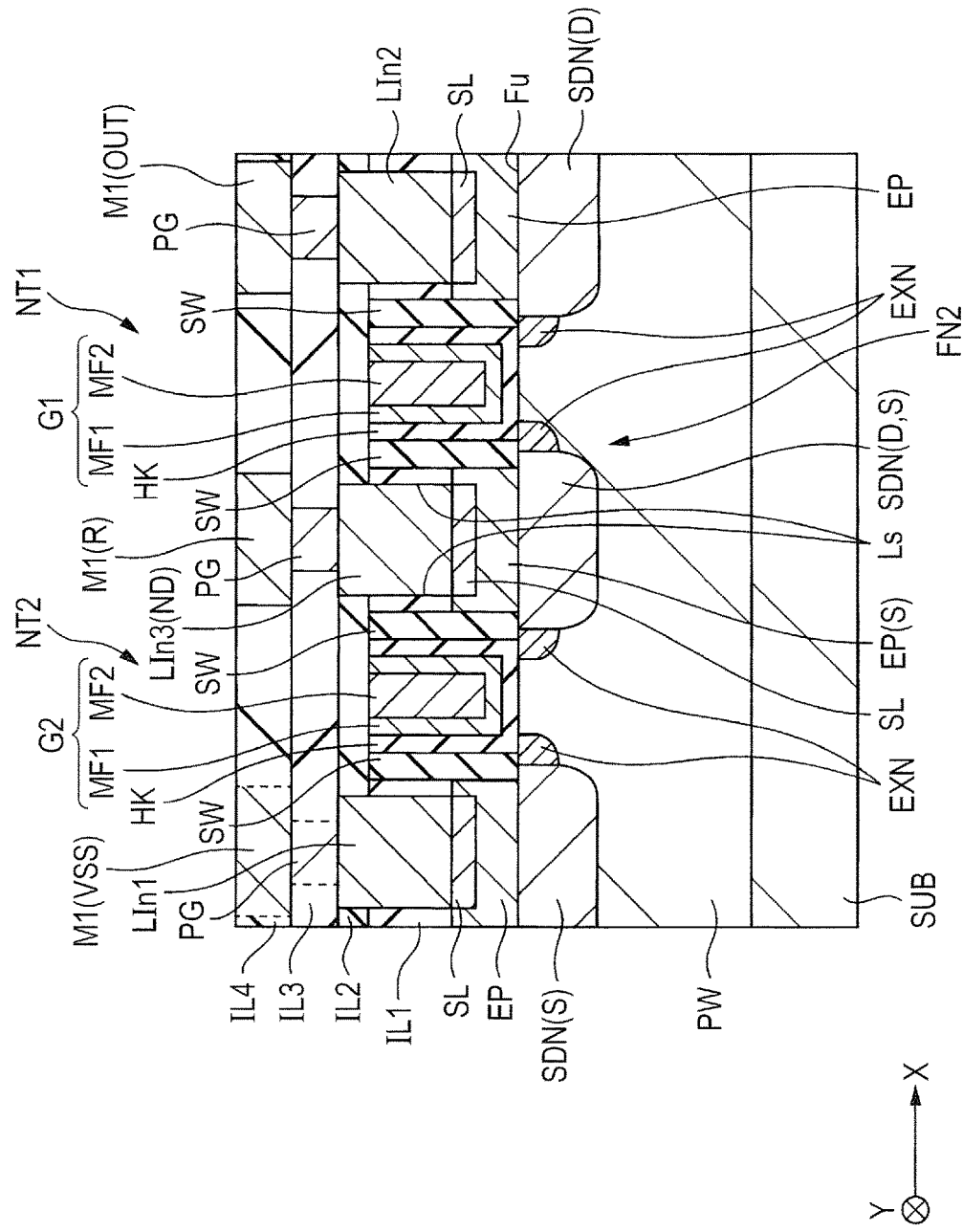
FIG. 7 is a sectional view taken along the line C-C of FIG. 2.
Figure 8:
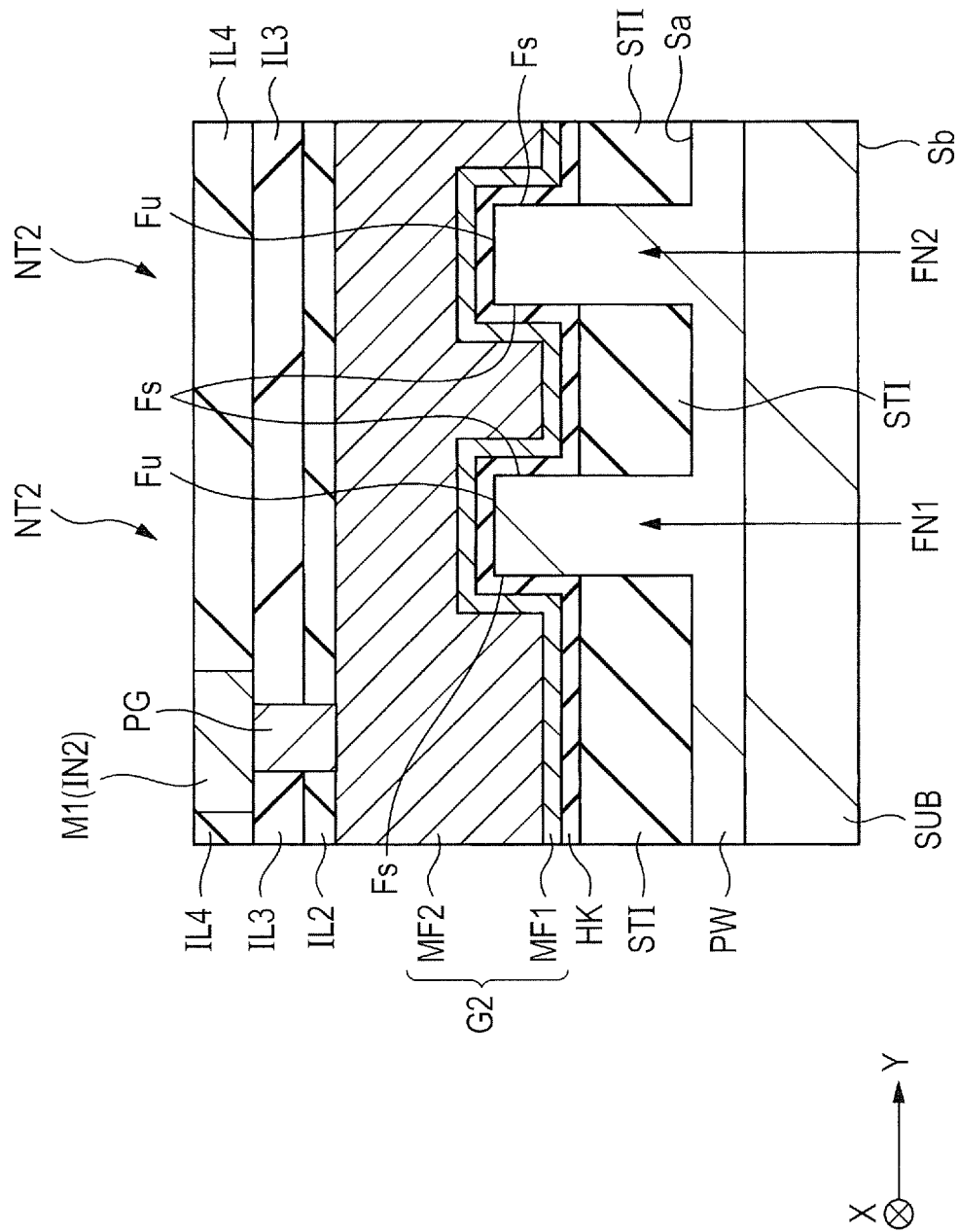
FIG. 8 is a sectional view taken along the line D-D of FIG. 2.
Figure 9:
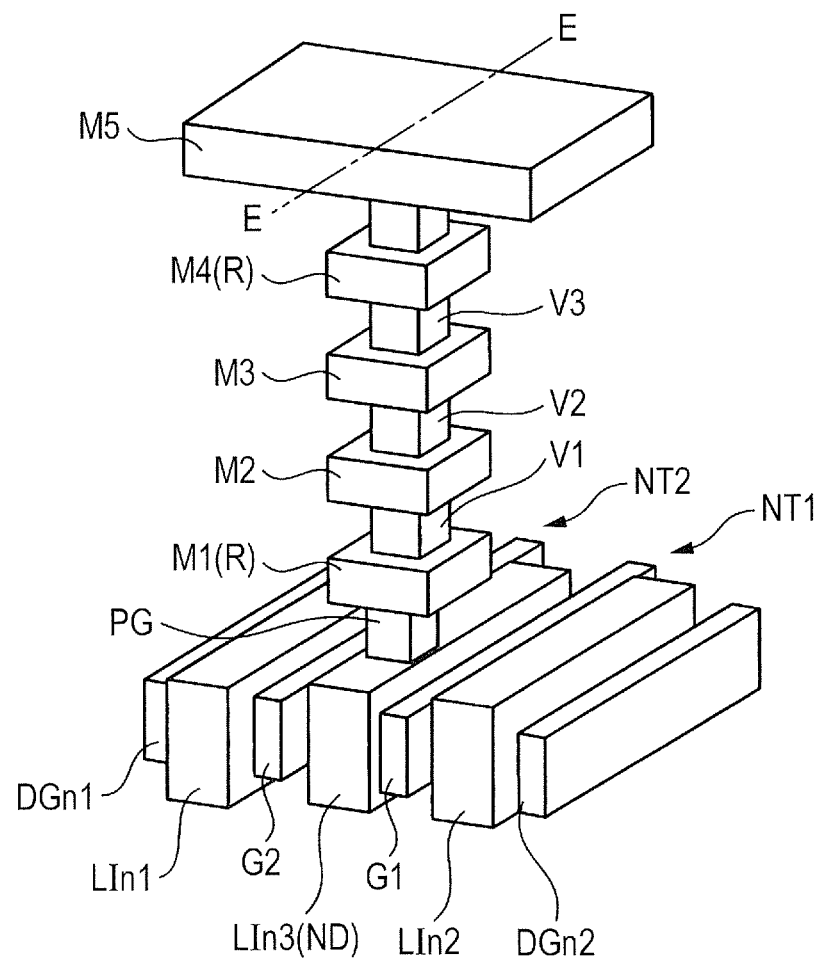
FIG. 9 is a fragmentary perspective view which shows the semiconductor device according to the embodiment.
Figure 10:
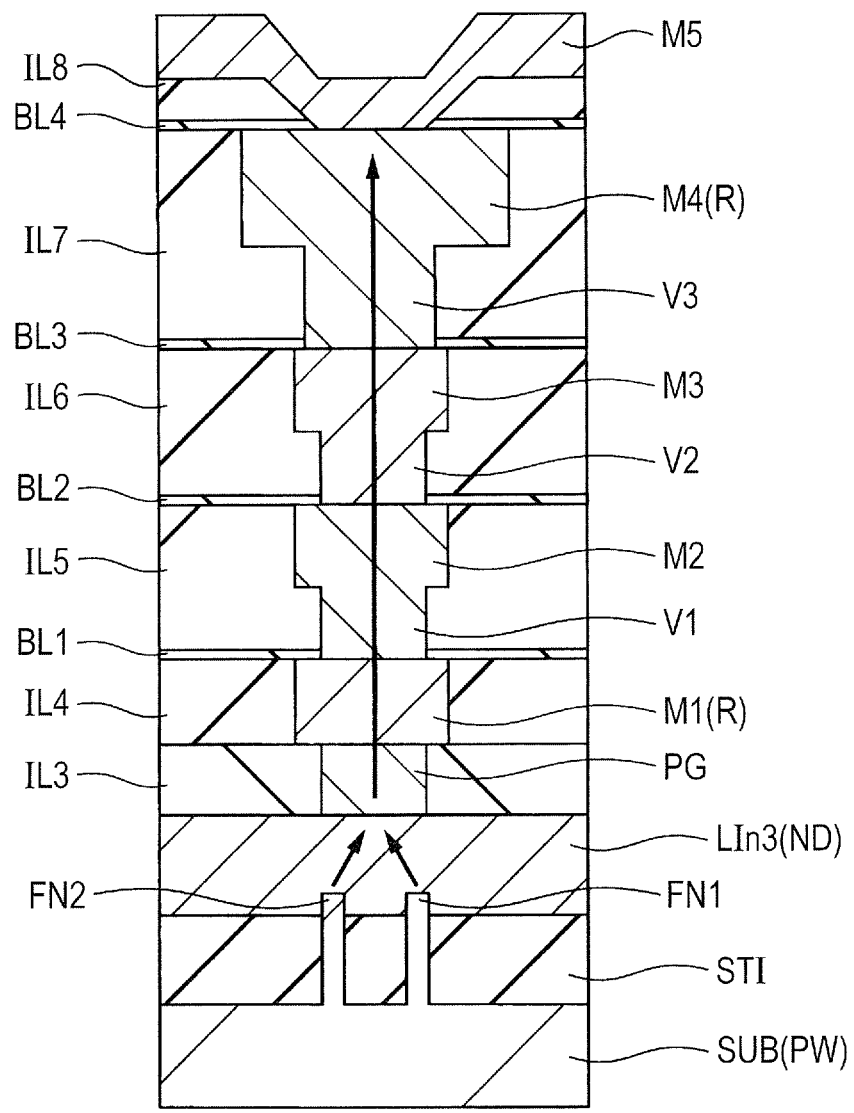
FIG. 10 is a sectional view taken along the line E-E of FIG. 9.
Figure 11:
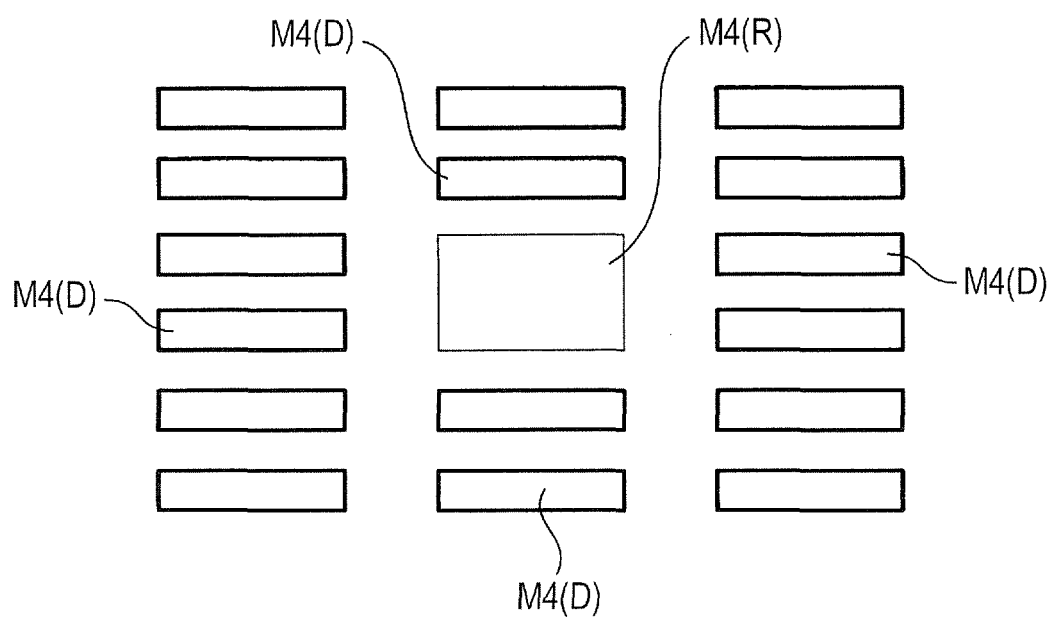
FIG. 11 is a fragmentary plan view which shows a wiring layer of the semiconductor device according to the embodiment.

Next, a semiconductor device (semiconductor integrated circuit device) according to an embodiment of the invention will be descried in detail. The semiconductor device according to this embodiment has a FINFET as a semiconductor element. FIG. 1 is an equivalent circuit diagram which shows the configuration of the semiconductor device according to this embodiment. FIG. 2 is a plan view which shows the configuration of the semiconductor device according to this embodiment. FIG. 3 is a plan view which shows the configuration of the semiconductor device according to this embodiment. FIG. 4 is a perspective view which schematically shows the configuration of the semiconductor device according to this embodiment. FIG. 5 is a sectional view taken along the line A-A of FIG. 2. FIG. 6 is a sectional view taken along the line B-B of FIG. 2. FIG. 7 is a sectional view taken along the line C-C of FIG. 2. FIG. 8 is a sectional view taken along the line D-D of FIG. 2. FIG. 9 is a fragmentary perspective view which shows the semiconductor device according to this embodiment. FIG. 10 is a sectional view taken along the line E-E of FIG. 9. FIG. 11 is a plan view of a wiring layer of the semiconductor device according to this embodiment.

FIG. 1 is an equivalent circuit diagram of a 2-input NAND circuit which configures the semiconductor device according to this embodiment. The 2-input NAND circuit includes a first P channel FET (PT1) and a second P channel FET (PT2) which are parallel-coupled between power potential (first power potential) VDD and output OUT, and a first N channel FET (NT1) and a second N channel FET (NT2) which are series-coupled between the output OUT and grounding potential (second power potential) VSS. The first P gate electrode of the first P channel FET (PT1) and the first N gate electrode of the first N channel FET (NT1) are coupled to input IN1 and the second P gate electrode of the second P channel FET (PT2) and the second N gate electrode of the second N channel FET (NT2) are coupled to input IN2. FET stands for Field Effect Transistor.

The point between the first N channel FET (NT1) and the second N channel FET (NT2) which are series-coupled serves as a node ND.

FIG. 2 is a plan view which shows the configuration of the semiconductor device according to this embodiment. FIG. 2 shows a logic circuit unit LCU1 in which a 2-iput NAND circuit is formed. In the drawing, the horizontal direction is defined as an X direction and the vertical direction is defined as a Y direction. The Y direction is perpendicular to the X direction.

The 2-input NAND circuit includes wiring M1 (VDD) to which a power potential is applied, and wiring M1 (VSS) to which a grounding potential is applied, in which both the wirings M1 (VDD) and M1 (VSS) extend in the X direction with a given distance between them. A P channel FET block PB and an N channel FET block NB are disposed between the wirings M1 (VDD) and M1 (VSS) and both the blocks extend in the X direction. In the P channel FET block PB, a plurality of P channel FETs (PTl, PT2) are formed and in the N channel FET block NB, a plurality of N channel FETs (NT1, NT2) are formed.

In the P channel FET block PB, semiconductor layers (protruding portions, fins, active regions) FP1 and FP2 extending in the X direction are disposed in parallel to each other with a given distance between them in the Y direction. Gate electrodes G1 and G2 and dummy gate electrodes DGp1 and DGp2 are disposed in a manner to cross the semiconductor layers FP1 and FP2, and the gate electrodes G1 and G2 and the dummy gate electrodes DGp1 and DGp2 extend in the Y direction. Furthermore, in the X direction, local wirings LIp1, LIp2, and LIp3, and dummy local wirings DLIp1 and DLIp2 are disposed in a manner to sandwich the gate electrodes G1 and G2 and the dummy gate electrodes DGp1 and DGp2 respectively. The local wirings LIp1, LIp2, and LIp3 and the dummy local wirings DLIp1 and DLIp2 extend in the Y direction. In the figure, the dummy gate electrodes DGp1 and DGp2 and dummy local wirings DLIp1 and DLIp2 are indicated by chain lines.

As shown in FIG. 2, the P channel FET(PT1) is formed at the intersection between the semiconductor layers FP1 and FP2 and the gate electrode G1 and the P channel FET(PT2) is formed at the intersection between the semiconductor layers FP1 and FP2 and the gate electrode G2. In the X direction, source regions and drain regions of the P channel FETs (PT1 and PT2) are formed in the semiconductor layers FP1 and FP2 at both ends of the gate electrodes G1 and G2. The source region of the P channel FET(PT1) is coupled to the wiring M1 (VDD) through the local wiring LIp2 and the drain region is coupled to wiring M1 (OUT) through the local wiring LIp3. Similarly, the source region of the P channel FET (PT2) is coupled to the wiring M1 (VDD) through the local wiring LIp1 and the drain region is coupled to the wiring M1 (OUT) through the local wiring LIp3.

The two P channel FETs (PT1) formed in the semiconductor layers FP1 and FP2 are parallel-coupled and function as a single P channel FET (PT1). Similarly, the P channel FET (PT2) includes two parallel-coupled P channel FETs (PT2).

As shown in FIG. 2, in the X direction, the dummy gate electrodes DGp1 and DGp2 are disposed in a manner to sandwich the gate electrodes G1 and G2 which configure the 2-input NAND circuit and the dummy local wirings DLIp1 and DLIp2 are disposed in a manner to sandwich the local wirings LIp1, LIp3, and LIp2 which configure the 2-input NAND circuit. The gate electrodes or dummy gate electrodes and the local wirings or dummy local wirings are disposed alternately in the X direction.

In the N channel FET block NB, semiconductor layers (protruding portions, fins, active regions) FN1 and FN2 extending in the X direction are disposed in parallel to each other with a given distance between them in the Y direction. The gate electrodes G1 and G2 and dummy gate electrodes DGn1 and DGn2 are disposed in a manner to cross the semiconductor layers FN1 and FN2 and the gate electrodes G1 and G2 and the dummy gate electrodes DGn1 and DGn2 extend in the Y direction. Furthermore, in the X direction, local wirings LIn1, LIn2, and LIn3, and dummy local wirings DLIn1 and DLIn2 are disposed in a manner to sandwich the gate electrodes G1 and G2 and the dummy gate electrodes DGn1 and DGn2 respectively. The local wirings LIn1, LIn2, and LIn3 and dummy local wirings DLIn1 and DLIn2 extend in the Y direction. In the figure, the dummy gate electrodes DGn1 and DGn2 and dummy local wirings DLIn1 and DLIn2 are indicated by chain lines.

As shown in FIG. 2, the N channel FET(NT1) is formed at the intersection between the semiconductor layers FN1 and FN2 and the gate electrode G1 and the N channel FET(NT2) is formed at the intersection between the semiconductor layers FN1 and FN2 and the gate electrode G2. In the X direction, source regions and drain regions of the N channel FETs (NT1 and NT2) are formed in the semiconductor layers FN1 and FN2 at both ends of the gate electrodes G1 and G2. The drain region of the N channel FET(NT1) is coupled to the wiring M1 (OUT) through the local wiring LIn2 and the source region is coupled to the wiring M1 (R) through the local wiring LIn3. Similarly, the source region of the N channel FET (NT2) is coupled to the wiring M1 (VSS) through the local wiring LIn1 and the drain region is coupled to the wiring M1 (R) through the local wiring LIn3.

The N channel FETs (NT1) formed in the semiconductor layers FN1 and FN2 are parallel-coupled and function as a single N channel FET (NT1). Similarly, the N channel FET (NT2) includes two parallel-coupled N channel FETs (NT2). The local wiring LIn3 couples the source region of the N channel FET (NT1) formed in the semiconductor layer FN1 and the source region of the N channel FET (NT1) formed in the semiconductor layer FN2. In other words, it couples the drain region of the N channel FET (NT2) formed in the semiconductor layer FN1 and the drain region of the N channel FET (NT2) formed in the semiconductor layer FN2.

The N channel FET (NT1) and N channel FET (NT2) are series-coupled and the source region of the N channel FET (NT1) and the drain region of the N channel FET (NT2) configure a common region in the semiconductor layer FN1 or FN2, which corresponds to the node ND shown in FIG. 1.

Therefore, in order to make up a 2-input NAND circuit, it is unnecessary to couple the wiring M1 to the local wiring LIn3 which corresponds to the node ND. However, in this embodiment, the wiring M1 (R) is coupled to the local wiring LIn3 which corresponds to the node ND, so that the heat generated in the semiconductor layers FN1 and FN2 can be dissipated through the wiring M1 (R). In other words, the local wiring LIn3 is coupled to the node ND between the series-coupled N channel FETs (NT1 and NT2) which configure the 2-input NAND circuit and further the wiring M1 (R) is coupled to the local wiring LIn3 so that the reliability of the N channel FETs (NT1 and NT2) is enhanced.

The gate electrode G1 is coupled to wiring M1 (IN1) which corresponds to the input IN1, and the gate electrode G2 is coupled to wiring M1 (IN2) which corresponds to the input IN2. The gate electrodes G1 and G2 of the P channel FETs (PT1 and PT2) may be called the first P gate electrode and the second P gate electrode, respectively and the gate electrodes G1 and G2 of the N channel FETs (NT1 and NT2) may be called the first N gate electrode and the second N gate electrode, respectively.

As shown in FIG. 2, in the X direction, the dummy gate electrodes DGn1 and DGn2 are disposed in a manner to sandwich the gate electrodes G1 and G2 which configure the 2-input NAND circuit, and the dummy local wirings DLIn1 and DLn2 are disposed in a manner to sandwich the local wirings LIn1, LIn2, and LIn3 which configure the 2-input NAND circuit. The gate electrodes or dummy gate electrodes and the local wirings or dummy local wirings are disposed alternately in the X direction.

FIG. 3 is a plan view which shows the configuration of the semiconductor device according to this embodiment. FIG. 3 shows a pattern which includes the semiconductor layers FP1, FP2, FN1, and FN2, gate electrodes G1 and G2, dummy gate electrodes DGp1, DGp2, DGn1, and DGn2, local wirings LIp1, LIp2, LIp3, LIn1, LIn2, and LIn3, and dummy local wirings DLIp1, DLIp2, DLIn1, and DLIn2.

In the P channel FET block PB, the gate electrodes G1 and G2 and the dummy gate electrodes DGp1 and DGp2 each have width W1 and are arranged with pitch a in the X direction. Specifically, the distance between adjacent gate electrodes is equal to the distance between a gate electrode and a dummy gate electrode which are adjacent to each other.

The local wirings LIp1, LIp2, and LIp3 and the dummy local wirings DLIp1 and DLIp2 each have width W2 and are arranged with pitch b in the X direction. Specifically, the distance between adjacent local wirings is equal to the distance between a local wiring and a dummy local wiring which are adjacent to each other. The sequence of arrangement of the gate electrodes G1 and G2, dummy gate electrodes DGp1 and DGp2, local wirings LIp1, LIp2, and LIp3, and dummy local wirings DLIp1 and DLIp2 is as shown in FIG. 3.

In the N channel FET block, the relation between the gate electrodes G1 and G2 and the dummy gate electrodes DGn1 and DGn2 is the same as the above relation between the gate electrodes G1 and G2 and the dummy gate electrodes DGp1 and DGp2. The relation between the local wirings LIn1, LIn2, and LIn3 and the dummy local wirings DLIn1 and DLIn2 is the same as the above relation between the local wirings LIp1, LIp2, and LIp3 and the dummy local wirings DLIp1 and DLIp2.

In FIG. 3, the chain lines extending in the Y direction are virtual straight lines IM and for example, they are centerlines of the gate electrodes G1 and G2 and centerlines of the local wirings LIp3 and LIn3. In other words, the local wirings LIp3 and LIn3 arranged in the Y direction are on a virtual straight line IM. Also, the dummy gate electrodes DGp1 and DGn1 are on a virtual straight line IM; the dummy gate electrodes DGp2 and DGn2 are on a virtual straight line IM; the local wirings LIp1 and LIn1 are on a virtual straight line IM; the local wirings LIp2 and LIn2 are on a virtual straight line IM; the dummy local wirings DLIp1 and DLIn1 are on a virtual straight line IM; and the dummy local wirings DLIp2 and DLIn2 are on a virtual straight line IM.

Although this embodiment is an example that a P channel FET (PT1) is formed in two semiconductor layers FP1 and FP2, instead the number of semiconductor layers may be one or three or more. Similarly, instead of the two semiconductor layers FN1 and FN2, the number of semiconductor layers may be one or three or more.

Although in this embodiment the gate electrode of the P channel FET (PT1) and that of the N channel FET (NT1) are integrated (as one continuous conductor layer) to make the gate electrode G1, instead the gate electrode of the P channel FET (PT1) and the gate electrode of the N channel FET (NT1) may be separated.

Also, the dummy gate electrodes DGp1 and DGn1 or the dummy gate electrodes DGp2 and DGn2 may be integrated (as one continuous conductor layer). Also, the dummy local wirings DLIp1 and DLIn1 or the dummy local wirings DLIp2 and DLIn2 may be integrated (as one continuous conductor layer).

The dummy gate electrodes DGp1, DGn1, DGp2, and DGn2 are intended to ensure high precision machining for the gate electrodes G1 and G2, and the dummy local wirings DLIp1, DLIn1, DLIp2, and DLIn2 are intended to ensure high precision machining for the local wirings LIp1, LIn1, LIp2, LIn2, LIp3, and LIn3. For example, the presence of the dummy gate electrodes or dummy local wirings can improve the machining accuracy (shape, dimensions, etc.) for the gate electrodes or local wirings in a photolithographic step or etching step. For that purpose, it is important that the dummy gate electrodes DGp1, DGn1, DGp2, and DGn2 should be arranged with the above pitch a, at both the sides of the gate electrodes G1 and G2 which configure the 2-input NAND circuit . Similarly, it is important that the dummy local wirings DLIp1, DLIn1, DLIp2, and DLIn2 should be arranged with the above pitch b at both the sides of the local wirings LIp1, LIn1, LIp2, LIn2, LIp3, and LIn3.

FIG. 4 is a perspective view which schematically shows the configuration of the semiconductor device according to this embodiment. Here, an explanation is given of the N channel FET (NT2) shown in FIG. 2 and the other N channel FET (NT1) and the P channel FETs (PT1 and PT2) also have the same structure.

An element isolation film STI is formed over the semiconductor substrate SUB and the semiconductor layer FN2 is a protruding portion formed over the semiconductor substrate SUB. The semiconductor layer FN2 penetrates the element isolation film STI and protrudes from the main surface of the element isolation film STI. The semiconductor layer FN2 has a desired width (for example, 5 to 20 nm or so) in the Y direction and extends in the X direction. The semiconductor substrate SUB is, for example, made of monocrystalline silicon and the element isolation film STI is, for example, an insulating film such as a silicon oxide film.

The gate electrode G2 extends in the Y direction in a manner to stride over the semiconductor layer FN2's portion protruding from the element isolation film STI. The gate electrode G2 has metal films MF1 and MF2 and is disposed over the semiconductor layer FN2 through a gate insulating film HK. Preferably, a high-permittivity film with a higher relative permittivity than silicon nitride film should be used for the gate insulating film HK. For example, an insulating film of HfSiO (hafnium silicate), HfAlON (nitrogenized hafnium aluminate) or $Y_2O_3$ (yttrium oxide) may be used for the gate insulating film HK. For the gate electrode G2, it is preferable to use metal film rather than polysilicon film. For example, the metal film MF1 may be TiAl (titanium aluminum) film and the metal film MF2 may be an Al (aluminum) film.

A sidewall insulating film SW is formed over the sidewall of the gate electrode G2 through the gate insulating film HK. The sidewall insulating film SW may be, for example, a silicon nitride film or a laminated film of silicon nitride film and silicon oxide film. If it is a laminated film, preferably the silicon nitride film should lie in a manner to contact the gate insulating film HK. The gate insulating film HK has only to lie between the gate electrode G2 and the semiconductor layer FN2 and need not be necessarily formed over the sidewall of the gate electrode G2.

In the X direction, a source region and a drain region for the N channel FET (PT2) are formed at both the ends of the gate electrode G2 and sidewall insulating film SW. The source region and drain region are formed in an epitaxial layer EP formed on the surface of the semiconductor layer FN2. Here, the epitaxial layer EP is, for example, made of SiP (silicon phosphide) or SiC (silicon carbide). In the case of the P channel FET (PT1 and PT2) , the epitaxial layer EP is, for example, made of SiGe (silicon germanium).

As shown in FIG. 4, the local wirings LIn1 and LIn3 made of metal film are formed over the epitaxial layer EP. The local wirings LIn1 and LIn3 extend in the Y direction in a manner to stride over the epitaxial layer EP.

FIG. 5 is a sectional view taken along the line A-A of FIG. 2. The P channel FET (PT2) is formed in an N-type well region (N-type semiconductor region) NW formed in the P-type semiconductor substrate SUB. The semiconductor layer FP1 is a protruding portion which protrudes from the main surface Sa of the semiconductor substrate SUB and the main surface of the semiconductor layer FP1 as the top of the protruding portion protrudes high from the main surface of the element isolation film STI . The N-type well region NW is formed in this protruding portion and reaches the bottom of the element isolation film STI.

The gate electrode G2 which has metal films MF1 and MF2 through a gate insulating film HK is formed on the main surface of the semiconductor layer FP1. The gate insulating film HK, gate electrode G2, and sidewall insulating film SW are as described above referring to FIG. 4.

A source region S and a drain region D for the P channel FET (PT2) are formed in the semiconductor layer FP1 at both the sides of the gate electrode G2. The source region S and drain region D each include a semiconductor region SDP and a semiconductor region EXP which are formed in the semiconductor layer FP1, and an epitaxial layer EP formed over the semiconductor layer FP1. The source region S and drain region D are P-type semiconductor regions doped with P-type impurities and the impurity concentration of the semiconductor region EXP is lower than the impurity concentrations of the semiconductor region SDP and epitaxial layer EP.

A silicide layer SL is formed over the surface of the epitaxial layer EP as the source region S and the local wiring LIp1 made of metal film is coupled to the silicide layer SL and the local wiring LIp1 is coupled to the wiring M1 (VDD) through a plug electrode PG.

A silicide layer SL is formed over the surface of the epitaxial layer EP as the drain region D, and the local wiring LIp3 made of metal film is coupled to the silicide layer SL and the local wiring LIp3 is coupled to the wiring M1 (OUT) through a plug electrode PG.

In the X direction, the dummy gate electrode DGp1 and dummy local wiring DLIp1 are sequentially arranged opposite to the gate electrode G2 with respect to the local wiring LIp1. The dummy gate electrode DGp1 has the same structure as the gate electrode G2 and the dummy local wiring DLIp1 has the same structure as the local wirings LIp1 and LIp3.

An epitaxial layer EP and a semiconductor region SDP are also formed under the dummy local wiring DLIp1. A pseudo FET, which has the dummy gate electrode DGp1 as a gate electrode, is formed adjacent to the P channel FET (PT2). The dummy gate electrode DGp1 has a floating potential and the pseudo FET cannot conduct electricity. The dummy local wiring DLIp1 also has a floating potential. In other words, the dummy gate electrode DGp1 and dummy local wiring DLIp1 are not coupled to the wiring M1 and are electrically isolated from the 2-input NAND circuit.

An interlayer insulating film IL1 covers the element isolation film STI and the epitaxial layer EP and it is, for example, an insulating film such as a silicon oxide film. The interlayer insulating film IL1 covers the side face of the gate electrode G2 through the sidewall insulating film SW and gate insulating film HK.

An interlayer insulating film IL2 is formed over the interlayer insulating film IL1 and covers the gate electrode G2 and dummy gate electrode DGp1. The interlayer insulating film IL2 is, for example, an insulating film such as a silicon oxide film or silicon nitride film. The local wirings LIp1 and LIp3 and the dummy local wiring DLIp1 penetrate the interlayer insulating films IL2 and IL1 and join the silicide layer SL, and the sidewalls of the local wirings LIp1 and LIp3 and dummy local wiring DLIp1 contact the interlayer insulating films IL2 and IL1 and are surrounded by the interlayer insulating films IL2 and IL1.

An interlayer insulating film IL3 is formed over the interlayer insulating film IL2 and covers the local wirings LIp1 and LIp3 and dummy local wiring DLIp1. The interlayer insulating film IL3 is, for example, an insulating film such as a silicon oxide film. The plug electrodes PG penetrate the interlayer insulating film IL3 and join the local wirings LIp1 and LIp3 and the sidewalls of the plug electrodes PG contact the interlayer insulating film IL3 and are surrounded by the interlayer insulating film IL3.

An interlayer insulating film IL4 is formed over the interlayer insulating film IL3 and the wirings M1 (VDD) and M1 (OUT) penetrate the interlayer insulating film IL4 and join the plug electrodes PG. The sidewalls of the wirings M1 (VDD) and M1 (OUT) contact the interlayer insulating film IL4 and are surrounded by the interlayer insulating film IL4. In order to decrease the inter-wiring capacity, the interlayer insulating film IL4 is formed as a film with a lower relative permittivity than the interlayer insulating films IL1, IL2, and IL3, which is called a low-k film (relative permittivity of 3.0 or less). Among low-k films are hydrogen silsesquioxane (SQ), methylated silsesquioxane (MSQ) and carbon-containing silicon oxide film (SiOC).

FIG. 6 is a sectional view taken along the line B-B of FIG. 2. Here, an explanation is given of the P channel FET (PT2), and the P channel FET (PT1) has the same structure as the P channel FET (PT2). Also, the N channel FETs (NT1, NT2) have a similar structure. Specifically, in the case of the N channel FETs, the semiconductor region SDP is replaced by the semiconductor region SDN and the N-type well region NW is replaced by the P-type well region PW.

As shown in FIG. 6, the semiconductor layers (protruding portions, fins, active regions) FP1 and FP2 penetrate the element isolation film STI and protrude from the main surface Sa of the semiconductor substrate SUB. In FIG. 6, the semiconductor layers FP1 and FP2 are expressed by rectangles, but instead they may have rounded upper end corners or may be almost trapezoidal or triangular with inclined long sides at both sides (side faces, sidewalls). It is important that the semiconductor layers FP1 and FP2 should have a desired width in the Y direction, a desired height of the protruding portion from the element isolation film STI and a desired length in the X direction. Similarly, the semiconductor layers FN1 and FN2 have a desired width, a desired height, and a desired length.

As shown in FIG. 6, an epitaxial layer EP is formed in the protruding portion from the element isolation film STI in each of the semiconductor layers FP1 and FP2 so that the protruding portion from the element isolation film STI in each of the semiconductor layers FP1 and FP2, and the epitaxial layer EP configure a P-type semiconductor region SDP. The semiconductor region SDP is the source region S of the P channel FET (PT2).

The local wiring LIp1 is disposed in a manner to overlap the two epitaxial layers EP formed in the semiconductor layers FP1 and FP2 so that the two epitaxial layers EP (source regions) are electrically coupled by the local wiring LIp1. A silicide layer SL is formed in the interface between the two epitaxial layers EP and the local wiring LIp1 to reduce the contact resistance between them.

Furthermore, the local wiring LIp1 is coupled to the wiring M1 (VDD) to which the power potential is supplied through the plug electrode PG. The interlayer insulating films IL1 to IL4 are as mentioned earlier.

FIG. 7 is a sectional view taken along the line C-C of FIG. 2. The N channel FETs (NT1 and NT2) are formed in a P-type well region (P-type semiconductor region) PW formed on the P-type semiconductor substrate SUB. The gate electrode G1 of the N channel FET (NT1) and the gate electrode G2 of the N channel FET (NT2) are formed over the main surface Fu of the semiconductor layer FN2 through a gate insulating film HK.

The source region S and drain region D of each of the N channel FETs (NT1 and NT2) are formed in the semiconductor layer FN2 at both sides of each of the gate electrodes G1 and G2. The source region S and drain region D each include a semiconductor region SDN and a semiconductor region EXN which are formed in the semiconductor layer FN2, and an epitaxial layer EP. The source region S and drain region D are N-type semiconductor regions doped with N-type impurities and the impurity concentration of the semiconductor region EXN is lower than the impurity concentrations of the semiconductor region SDN and epitaxial layer EP.

As described earlier referring to FIG. 2, the N channel FETs (NT1 and NT2) are series-coupled and the source region S of the N channel FET (NT1) and the drain region D of the N channel FET (NT2) configure a common semiconductor region SDN. This common semiconductor region SDN corresponds to the node ND shown in FIG. 1. An epitaxial layer EP is formed over the common semiconductor region SDN and the local wiring LIn3 is formed over the epitaxial layer EP through a silicide layer SL formed on the surface of the epitaxial layer EP. Furthermore, the wiring M1 (R) for heat dissipation is coupled to the local wiring LIn3 through a plug electrode PG.

An epitaxial layer EP is also formed over the semiconductor region SDN as the drain region D of the N channel FET (NT1) and the local wiring LIn2 is formed over the epitaxial layer EP through a silicide layer SL formed on the surface of the epitaxial layer EP. Furthermore, the local wiring LIn2 is coupled to the wiring M1 (OUT) for output through a plug electrode PG.

An epitaxial layer EP is also formed over the semiconductor region SDN as the source region S of the N channel FET (NT2) and the local wiring LIn1 is formed over the epitaxial layer EP through a silicide layer SL formed on the surface of the epitaxial layer EP. Furthermore, the local wiring LIn1 is coupled to the wiring M1 (VSS) for the grounding potential through a plug electrode PG. The wiring M1 (VSS) and the plug electrode PG coupled to it are indicated by broken lines since they do not appear in FIG. 7 which shows the cross section taken along the line C-C of FIG. 2.

The gate insulating film HK, metal films MF1 and MF2, and sidewall insulating film SW are as described above referring to FIG. 4 and the interlayer insulating films IL1 to IL4 are as described above referring to FIG. 5.

As described earlier, in this embodiment, the wiring M1 (R) is coupled to the local wiring LIn3 which corresponds to the node ND, so that the heat generated in the semiconductor layers FN1 and FN2 is dissipated through the wiring M1 (R). Specifically, the local wiring LIn3 is coupled to the node ND between the series-coupled N channel FETs (NT1 and NT2) which configure the 2-input NAND circuit and further the wiring M1 (R) is coupled to the local wiring LIn3 so that the reliability of the N channel FETs (NT1 and NT2) is enhanced.

FIG. 8 is a sectional view taken along the line D-D of FIG. 2. The semiconductor layers FN1 and FN2 have a main surface Fu and two side faces (sidewalls) Fs in the Y direction. A gate insulating film HK is formed along the main surface Fu and side faces Fs in a manner to cover the semiconductor layers FN1 and FN2 exposed from the element isolation film STI, and the gate electrode G2 is formed over the gate insulating film HK. The gate electrode G2 has a laminated structure which includes a metal film MF1 and a metal film MF2 disposed over it.

Furthermore, the gate electrode G2 is coupled to the wiring M1 (IN2) for input through a plug electrode PG.

FIG. 9 is a fragmentary perspective view which shows the semiconductor device according to this embodiment. FIG. 10 is a sectional view taken along the line E-E of FIG. 9. It shows the heat dissipation structure coupled to the local wiring LIn3.

The local wiring LIn3 is coupled to the wiring M1 (R) through a plug electrode PG. The wiring M1 (R) is coupled to a via conductor layer V1, wiring M2, via conductor layer V2, wiring M3, via conductor layer V3, wiring M4 (R) , and wiring M5 sequentially. The laminated structure from the plug electrode PG to the wiring M5 is a heat dissipation structure. The wiring M1 (R), via conductor layer V1, wiring M2, via conductor layer V2, wiring M3, via conductor layer V3, wiring M4 (R) , and wiring M5 are coupled only to the local wiring LIn3, forming an independent pattern and they are not coupled to any other wiring.

As shown in FIG. 10, the interlayer insulating film IL4 surrounding the side face of the wiring M1 (R), the interlayer insulating film IL5 surrounding the side faces of the wiring M2 and via conductor layer V1, and the interlayer insulating film IL6 surrounding the side faces of the wiring M3 and via conductor layer V2 are made of low-k film as mentioned above. The interlayer insulating film IL7 surrounding the side faces of the wiring M4 (R) and via conductor layer V3, and the interlayer insulating film IL8 disposed over the interlayer insulating film IL7 are made of insulating film which is higher in relative permittivity than the interlayer insulating films IL4 to IL6 and lower in relative permittivity than the interlayer insulating films IL1 to IL3. The interlayer insulating films IL7 and IL8 are, for example, made of fluorine(F)-containing silicon oxide film (SiOF).

In FIG. 10, the arrows represent a heat dissipation path. The heat generated in the semiconductor layers FN1 and FN2 is dissipated through the heat dissipation structure. Particularly, since the interlayer insulating films IL7 and IL8 are higher in heat conductivity than the interlayer insulating films IL4 to IL6, it is preferable to couple the local wiring LIn3 up to the wiring M4(R) or M5.

Here, the plug electrode PG has a laminated structure which includes a barrier conductor film (for example, titanium film, titanium nitride film or laminated film including these films) and a tungsten film, etc. as amain conductor film. Concretely, the main conductor film is buried in the cup-shaped barrier conductor film.

The wiring M1 (R) is a copper wiring and has a structure in which the main conductor film (for example, copper plated film) is buried in the cup-shaped barrier conductor film (for example, titanium nitride film, tantalum film, or tantalum nitride film).

The wiring M4 (R) and via conductor layer V3 are integrated, for example, by the so-called dual damascene method, forming a laminated structure which includes a barrier conductor film (for example, titanium nitride film, tantalum film, or tantalum nitride film) abutting on the interlayer insulating film IL7 and wiring M3 and a main conductor film (for example, copper plated film) buried in it. Furthermore, the main surfaces of the wiring layer M4 (R) and interlayer insulating film IL7 are covered by a barrier insulating film BL4 which functions as a copper diffusion prevention film. The barrier insulating film BL4 is, for example, a SiCO film, SiCN film or the like (the same is true for BL1 to BL3). Also, the wiring M3 and via conductor layer V2, and the wiring M2 and via conductor layer V1 have the same structure as the wiring M4 (R) and via conductor layer V3. The wiring M5 has a laminated structure which includes a barrier film (for example, a lamination of titanium film and titanium nitride film) and a main conductor film (aluminum film or aluminum film containing impurities (trace of copper)) disposed over the barrier film.

FIG. 11 is a fragmentary plan view which shows a wiring layer of the semiconductor device according to this embodiment. Specifically, it shows the wiring pattern in the same layer as the wiring M4(R). As shown in FIG. 11, a plurality of wirings M4 (D) are arranged in a manner to surround the wiring M4 (R) as part of the heat dissipation structure. As shown in FIG. 10, the heat transferred from the semiconductor layers FN1 and FN2 through the heat dissipation structure to the wiring M4 (R) is also dissipated from the wirings M4 (D) , so the heat dissipation efficiency can be improved. The wirings M4 (D) are not coupled to any other wiring, making up an independent wiring pattern. Since the heat can also be dissipated through the side faces of the wirings M4(D), the heat dissipation efficiency can be improved. However, there is no problem even if the wirings M4(D) are coupled to another wiring or element (FET), etc.

Variation 1

Figure 12:
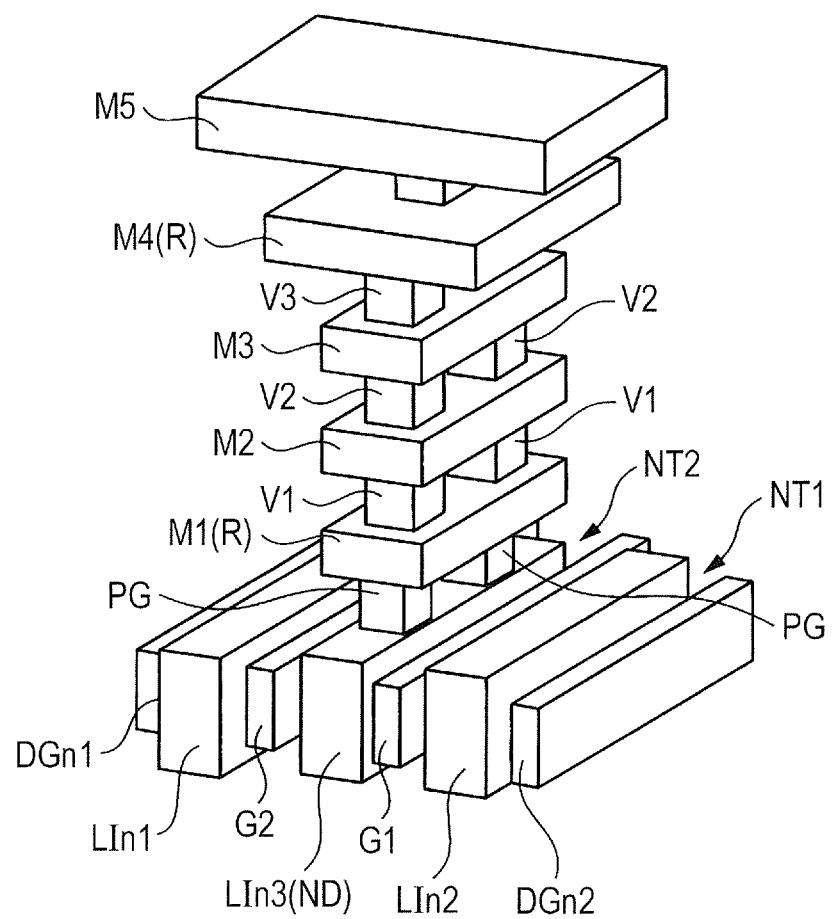
FIG. 12 is a fragmentary perspective view which shows the semiconductor device according to Variation 1.

Variation 1 is an example of variation of the above embodiment shown in FIG. 9. FIG. 12 is a fragmentary perspective view which shows the semiconductor device according to Variation 1.

As shown in FIG. 12, the local wiring LIn3 is coupled to the wiring M1 (R) through two plug electrodes PG and further coupled to the wirings M2, M3, and M4(R) through three via conductor layers V1, V2, and V3 sequentially.

Since two heat dissipation paths from the local wiring LIn3 to the wiring M4 (R) are provided by the use of the two plug electrodes PG and three via conductor layers V1, V2, and V3, the heat dissipation efficiency can be improved.

Variation 2

Figure 13:
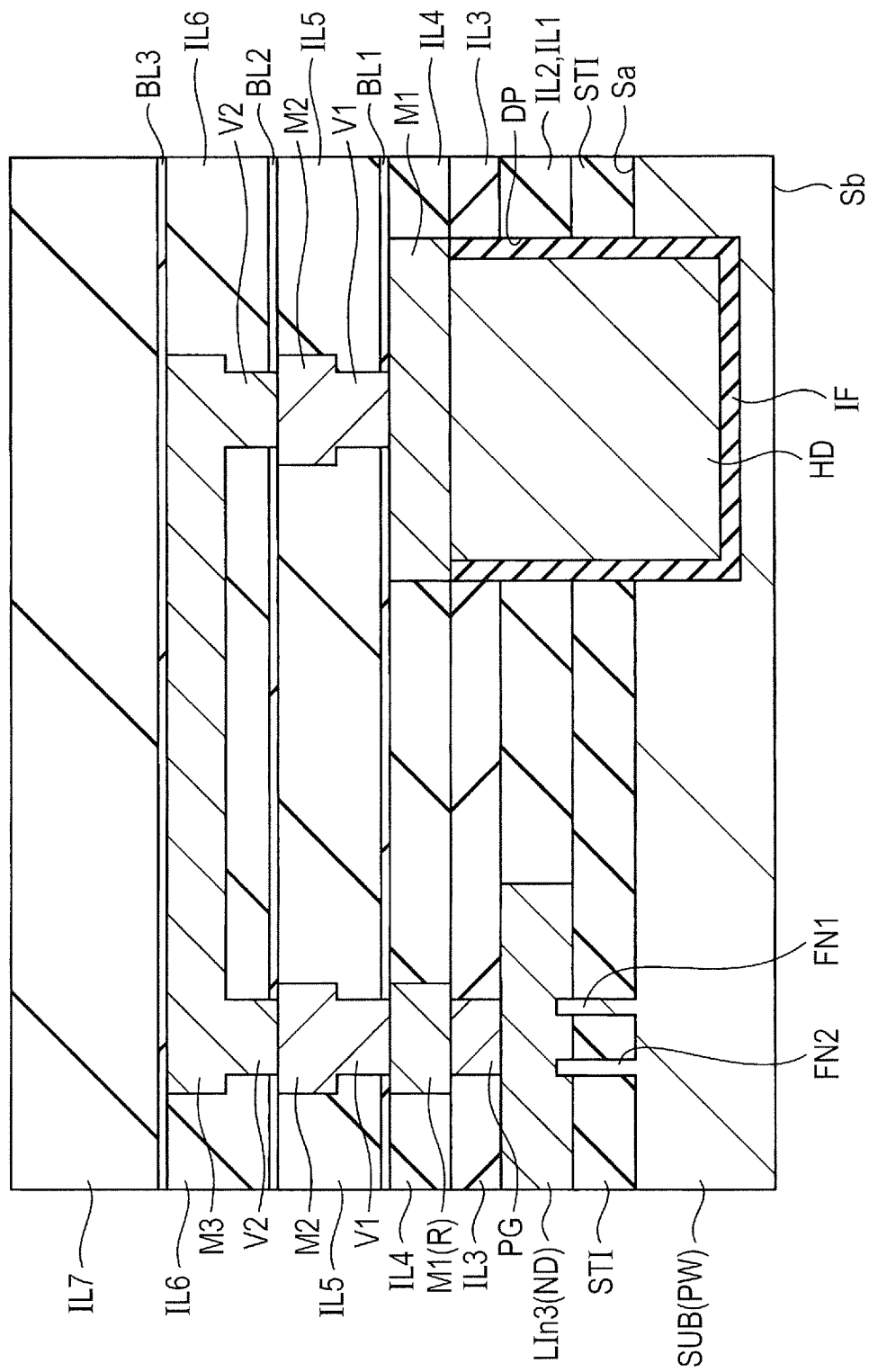
FIG. 13 is a sectional view which shows the configuration of a semiconductor device according to Variation 2.

FIG. 13 is a sectional view which shows the configuration of the semiconductor device according to Variation 2. As shown in FIG. 13, a heat dissipator HD is buried through an insulating film IF in a trench DP which penetrates the interlayer insulating films IL3, IL2, and IL1 and reaches the inside of the semiconductor substrate SUB. The heat dissipater HD is, for example, made of copper film or the like.

The heat dissipator HD is coupled to the wiring M3 through a wiring M1, via conductor layer V1, wiring M2, and via conductor layer V2 over the heat dissipator HD. On the other hand, the local wiring LIn3 coupled to the semiconductor layers FN1 and FN2 is coupled to the wiring M3 through the plug electrode PG, wiring M1 (R), via conductor layer V1, wiring M2, and via conductor layer V2.

The heat generated in the semiconductor layers FN1 and FN2 is transferred to the heat dissipator HD through the plug electrode PG, via conductor layers V1 and V2, wirings M1 (R), M2, M3, and M1 and dissipated, for example, to the semiconductor substrate SUB or the like.

Variation 3

Figure 14:
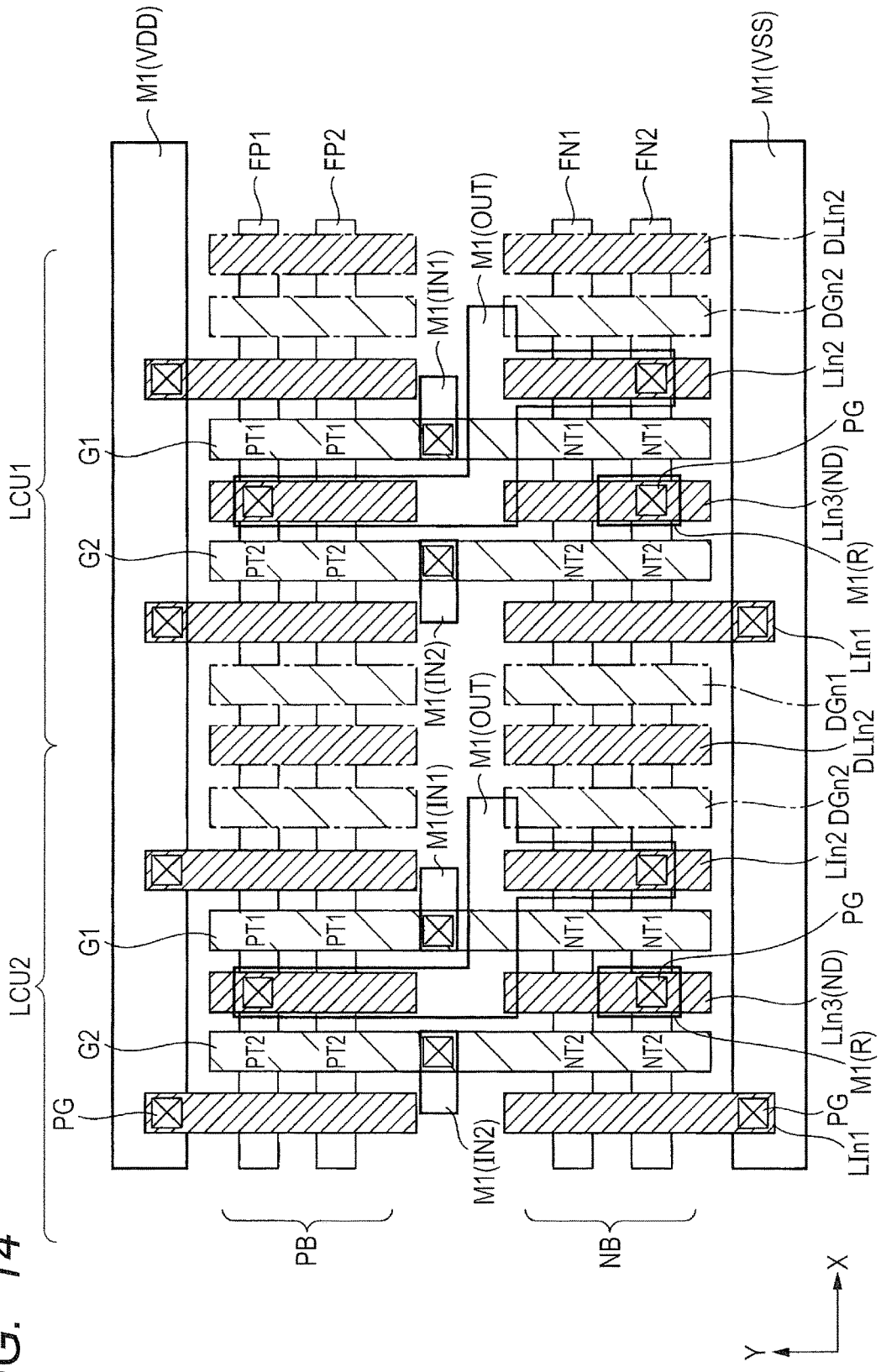
FIG. 14 is a plan view which shows the configuration of a semiconductor device according to Variation 3.
Figure 15:
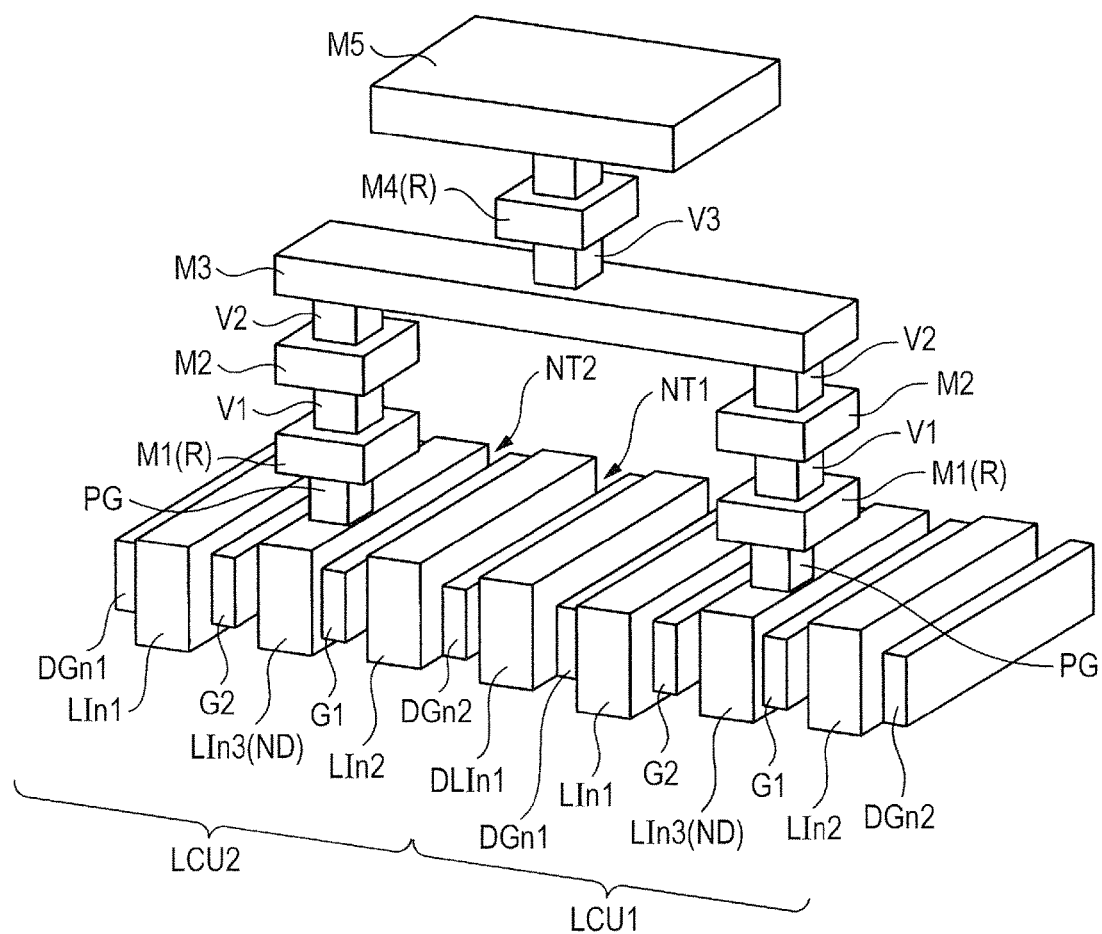
FIG. 15 is a fragmentary perspective view which shows the semiconductor device according to Variation 3.

FIG. 14 is a plan view which shows the configuration of the semiconductor device according to Variation 3. FIG. 15 is a fragmentary perspective view which shows the semiconductor device according to Variation 3.

As shown in FIG. 14, the semiconductor device according to Variation 3 includes two 2-input NAND circuits. A 2-input NAND circuit is formed in each of two adjacent logic circuit units LCU1 and LCU2. The heat dissipation structure according to the above embodiment is coupled to each of the local wirings LIn3 of the logic circuit units LCU1 and LCU2. In the semiconductor device according to Variation 3, as shown in FIG. 15, the two heat dissipation structures are coupled by the wiring M3 and the two heat dissipation structures share the via conductor layer V3, and wirings M4 (R) and M5 which are coupled to the wiring M3.

Specifically, the local wiring LIn3 of the logic circuit unit LCU1 is coupled to the common via conductor layer V3, and common wirings M4 (R) and M5 through a plug electrode PG, wiring M1 (R), via conductor layer V1, wiring M2, via conductor layer V2, and wiring M3. Similarly, the local wiring LIn3 of the logic circuit unit LCU2 is coupled to the common via conductor layer V3, and common wirings M4(R) and M5 through a plug electrode PG, wiring M1 (R), via conductor layer V1, wiring M2, via conductor layer V2, and wiring M3.

Variation 3 offers an advantageous effect that the freedom in the design of wiring layers at the same level as the wirings M4(R) and M5 can be improved, in addition to the advantageous effects offered by the above embodiment.

Variation 4

Variation 4 is an example as a variation of what is shown in FIG. 2 in the above embodiment, in which a heat dissipation structure is coupled to the dummy gate electrode DGp1 and dummy local wiring DLIp1. Instead, a heat dissipation structure may be coupled to either the dummy gate electrode DGp1 or the dummy local wiring DLIp1. Similarly, a heat dissipation structure may be coupled to at least one of the following: the dummy gate electrode DG2, DGn1, or DGn2 or the dummy local wiring DLIp2, DLIn1 or DLIn2.

Figure 16:
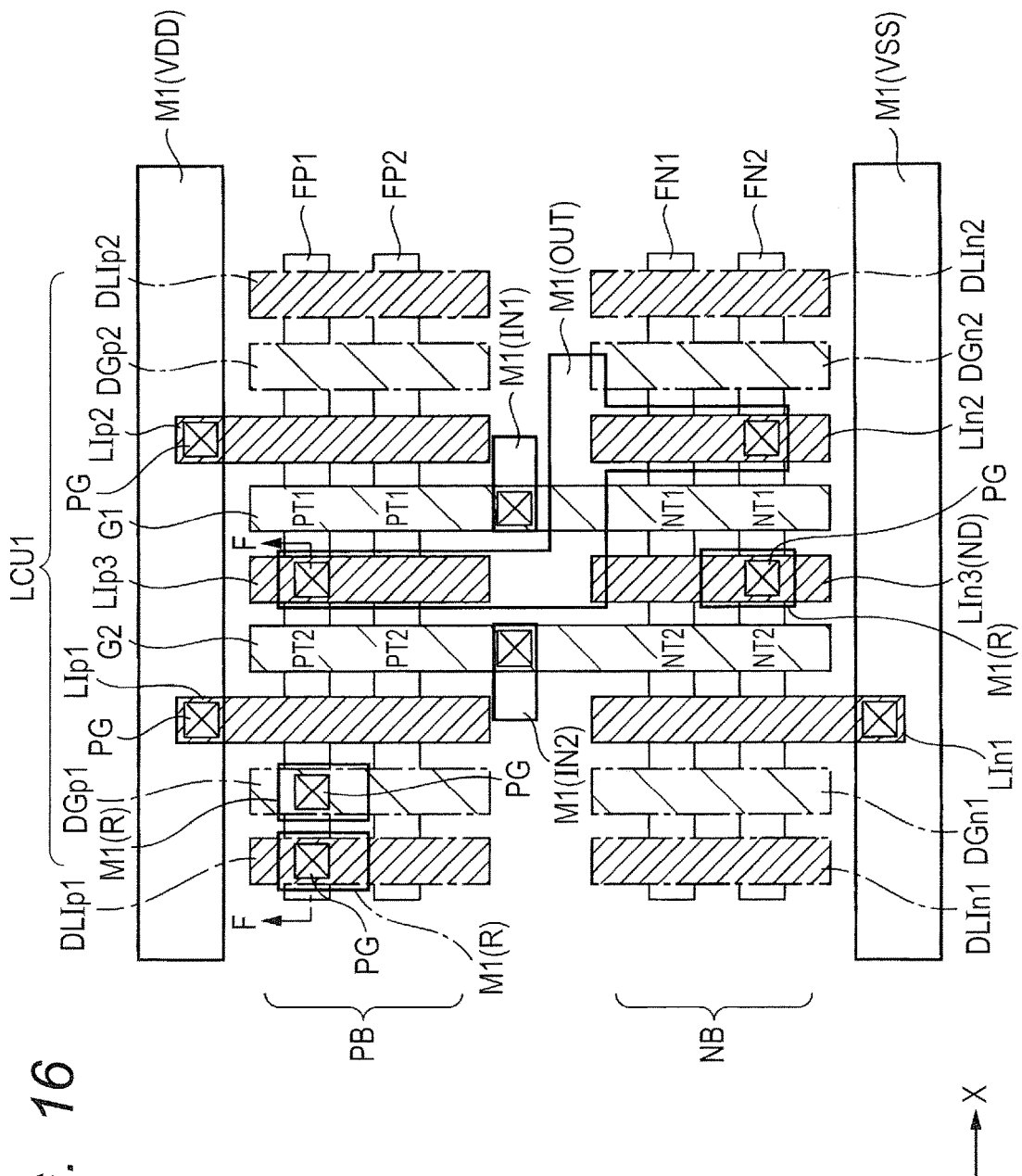
FIG. 16 is a plan view which shows the configuration of a semiconductor device according to Variation 4.
Figure 17:
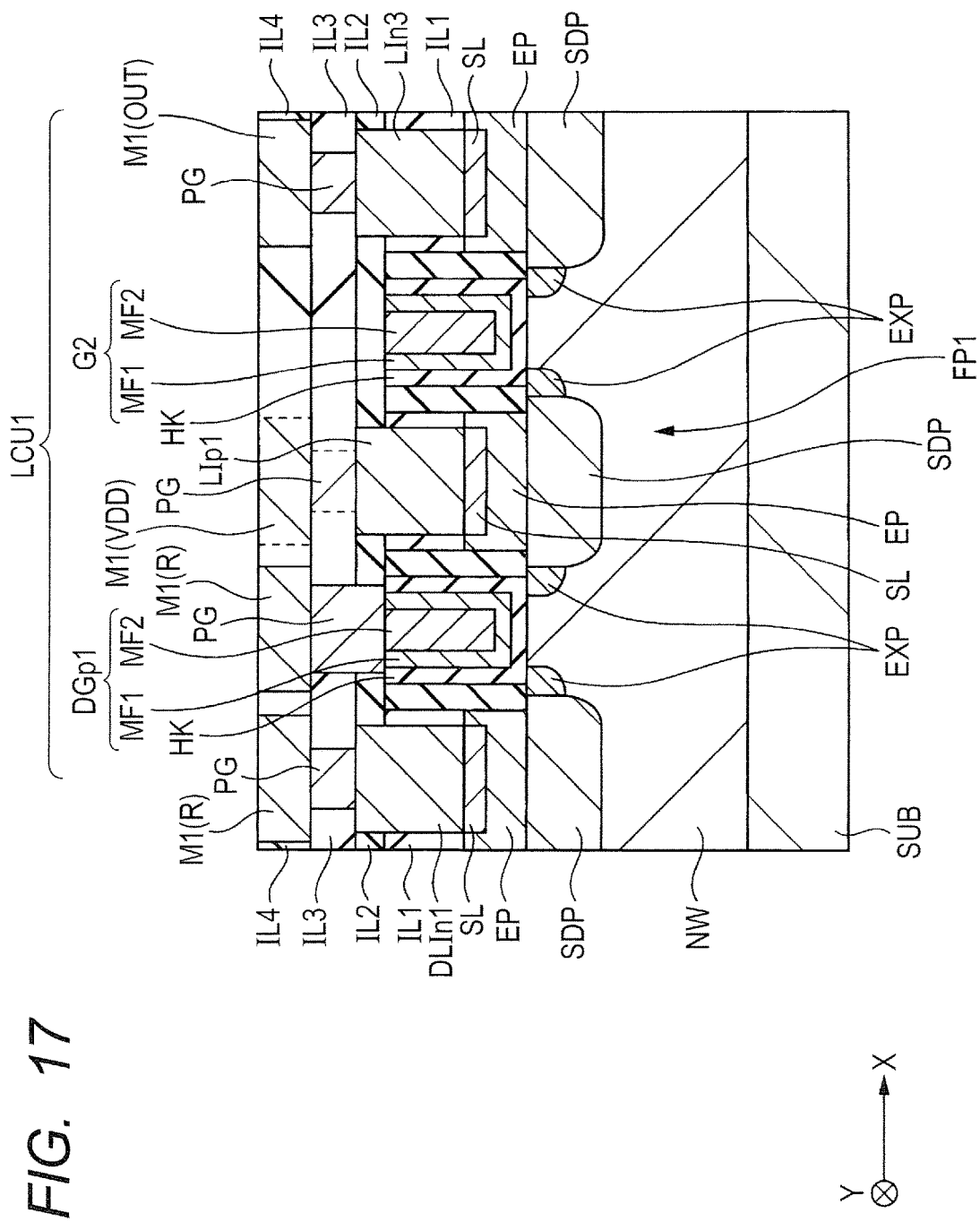
FIG. 17 is a sectional view taken along the F-F line of FIG. 16.

FIG. 16 is a plan view which shows the configuration of the semiconductor device according to Variation 4. FIG. 17 is a sectional view taken along the line F-F of FIG. 16.

As shown in FIGS. 16 and 17, a wiring M1 (R) for heat dissipation is coupled to the dummy gate electrode DGp1 through a plug electrode PG. The heat dissipation structure shown in FIGS. 9 and 10 according to the above embodiment is coupled to the dummy gate electrode DGp1. In this structure, a gate insulating film HK is disposed between the dummy gate electrode DGp1 and the semiconductor layer FP1, but the thickness of the gate insulating film HK is as small as about several nanometers and the heat generated in the semiconductor layer FP1 can be dissipated through the dummy gate electrode DGp1 and heat dissipation structure.

The same heat dissipation structure as the one shown in FIGS. 9 and 10 according to the above embodiment is also coupled to the dummy local wiring DLIp1.

Variation 4 can improve the heat dissipation characteristics of the P channel FET and N channel FET and enhance the reliability of the P channel FET and N channel FET. In addition, it can improve the heat dissipation characteristics without affecting the logic circuits.

Furthermore, Variation 4 maybe applied to a logic circuit other than a 2-input NAND circuit. For example, as a variation of what is shown in FIG. 2 in the above embodiment, an inverter circuit which includes a P channel FET (PT2) and an N channel FET (NT2) may be made by omitting the gate electrode G1 and local wirings LIp2 and LIn2 and coupling the local wirings LIp3 and LIn3 to the output wiring M1 (OUT). In that case as well, in the P channel FET block PB, it is important that the dummy gate electrodes DGp1 and DGp2 should be arranged in a manner to sandwich the gate electrode G2 and the dummy local wirings DLIp1 and DLIp2 should be arranged in a manner to sandwich the local wirings LIp1 and LIp3. Also, in the N channel FET block NB, it is important that the dummy gate electrodes DGn1 and DGn2 should be arranged in a manner to sandwich the gate electrode G2 and the dummy local wirings DLIn1 and DLIn2 should be arranged in a manner to sandwich the local wirings LIn1 and LIn3.

The invention made by the present inventors has been so far explained concretely in reference to the preferred embodiment (or variations of the embodiment) thereof. However, the invention is not limited to the above embodiment (or variations thereof). It is obvious that these details may be modified in various ways without departing from the gist thereof. For example, the invention includes the following examples.

Note 1

A semiconductor device with a logic circuit, the circuit including:

a P channel FET coupled between a first power potential wiring and an output wiring;

an N channel FET coupled between the output wiring and a second power potential wiring; and an input wiring coupled to a P gate electrode of the P channel FET and an N gate electrode of the N channel FET;

the semiconductor device including:

a semiconductor substrate having a main surface;

an element isolation film formed over the main surface of the semiconductor substrate;

a first semiconductor layer penetrating the element isolation film, protruding from the main surface of the semiconductor substrate, and extending in a first direction in plan view;

the P gate electrode and a dummy gate electrode disposed over the first semiconductor layer through a first gate insulating film and extending in a second direction perpendicular to the first direction;

a local wiring disposed between the P gate electrode and the dummy gate electrode in the first direction, extending in the second direction and being coupled to the first power potential wiring; and a first wiring coupled to the dummy gate electrode, in which the dummy gate electrode and the first wiring are electrically independent from the logic circuit and have a floating potential.

Note 2

A semiconductor device with a logic circuit, the circuit including:

a P channel FET coupled between a first power potential wiring and an output wiring;

an N channel FET coupled between the output wiring and a second power potential wiring; and an input wiring coupled to a P gate electrode of the P channel FET and an N gate electrode of the N channel FET;

the semiconductor device including:

a semiconductor substrate having a main surface;

an element isolation film formed over the main surface of the semiconductor substrate;

a first semiconductor layer penetrating the element isolation film, protruding from the main surface of the semiconductor substrate, and extending in a first direction in plan view;

the P gate electrode and a dummy gate electrode disposed over the first semiconductor layer through a first gate insulating film and extending in a second direction perpendicular to the first direction;

a local wiring disposed between the P gate electrode and the dummy gate electrode in the first direction, extending in the second direction and being coupled to the first power potential wiring;

a dummy local wiring disposed opposite to the local wiring with respect to the dummy gate electrode in the first direction, crossing the first semiconductor layer, and extending in the second direction;

a first interlayer insulating film being formed over the main surface of the semiconductor substrate, covering the P gate electrode and the dummy gate electrode, and abutting on a sidewall of the dummy local wiring;

a second interlayer insulating film disposed over the first interlayer insulating film; and a first wiring being coupled to the dummy local wiring and disposed over the second interlayer insulating film, in which the dummy local wiring is electrically independent from the logic circuit and has a floating potential.

What is claimed is:

1. A semiconductor device including a 2-input NAND circuit, the 2-input NAND circuit including:

a first P channel FET and a second P channel FET coupled in parallel between a first power potential wiring and an output wiring;

a first N channel FET and a second N channel FET coupled in series between the output wiring and a second power potential wiring;

a first input wiring coupled to a first P gate electrode of the first P channel FET and a first N gate electrode of the first N channel FET; and a second input wiring coupled to a second P gate electrode of the second P channel FET and a second N gate electrode of the second N channel FET, comprising:

a semiconductor substrate having a main surface;

an element isolation film formed on the main surface of the semiconductor substrate;

a first semiconductor layer penetrating the element isolation film, protruding from the main surface of the semiconductor substrate, and extending in a first direction in plan view;

the first P gate electrode and the second P gate electrode disposed over the first semiconductor layer through a first gate insulating film and extending in a second direction perpendicular to the first direction;

a first local wiring disposed between the first P gate electrode and the second P gate electrode in the first direction, extending in the second direction and coupled to the output wiring;

a second local wiring disposed opposite to the first local wiring with respect to the first P gate electrode in the first direction, crossing the first semiconductor layer, extending in the second direction and coupled to the first power potential wiring;

a third local wiring disposed opposite to the first local wiring with respect to the second P gate electrode in the first direction, crossing the first semiconductor layer, extending in the second direction and coupled to the first power potential wiring;

a dummy gate electrode disposed opposite to the second P gate electrode with respect to the third local wiring in the first direction, crossing the first semiconductor layer, extending in the second direction and disposed over the first semiconductor layer through a second gate insulating film;

a first interlayer insulating film formed over the main surface of the semiconductor substrate and covering the first P gate electrode, the second P gate electrode, and the dummy gate electrode; and a first wiring coupled to the dummy gate electrode and disposed over the first interlayer insulating film, wherein the dummy gate electrode and the first wiring are electrically independent from the 2-input NAND circuit and have a floating potential.

2. The semiconductor device according to claim 1, further comprising:

a plug electrode surrounded by the first interlayer insulating film in plan view and coupling the dummy gate electrode with the first wiring.

3. The semiconductor device according to claim 1, wherein in the first direction a first distance between the first P gate electrode and the second P gate electrode is equal to a second distance between the second P gate electrode and the dummy gate electrode.

4. A semiconductor device including a 2-input NAND circuit, the 2-input NAND circuit including:

a first P channel FET and a second P channel FET coupled in parallel between a first power potential wiring and an output wiring;

a first N channel FET and a second N channel FET coupled in series between the output wiring and a second power potential wiring;

a first input wiring coupled to a first P gate electrode of the first P channel FET and a first N gate electrode of the first N channel FET; and a second input wiring coupled to a second P gate electrode of the second P channel FET and a second N gate electrode of the second N channel FET, comprising:

a semiconductor substrate having a main surface;

an element isolation film formed on the main surface of the semiconductor substrate;

a first semiconductor layer penetrating the element isolation film, protruding from the main surface of the semiconductor substrate, and extending in a first direction in plan view;

the first P gate electrode and the second P gate electrode disposed over the first semiconductor layer through a first gate insulating film and extending in a second direction perpendicular to the first direction;

a first local wiring disposed between the first P gate electrode and the second P gate electrode in the first direction, extending in the second direction and being coupled to the output wiring;

a second local wiring disposed opposite to the first local wiring with respect to the first P gate electrode in the first direction, crossing the first semiconductor layer, extending in the second direction and being coupled to the first power potential wiring;

a third local wiring disposed opposite to the first local wiring with respect to the second P gate electrode in the first direction, crossing the first semiconductor layer, extending in the second direction and being coupled to the first power potential wiring;

a dummy gate electrode disposed opposite to the second P gate electrode with respect to the third local wiring in the first direction, crossing the first semiconductor layer, extending in the second direction, and disposed over the first semiconductor layer through a second gate insulating film;

a fourth local wiring disposed opposite to the third local wiring with respect to the dummy gate electrode in the first direction, crossing the first semiconductor layer, and extending in the second direction;

a first interlayer insulating film formed over the main surface of the semiconductor substrate, covering the first P gate electrode, the second P gate electrode, and the dummy gate electrode and abutting on a sidewall of the fourth local wiring;

a second interlayer insulating film disposed over the first interlayer insulating film; and a first wiring coupled to the fourth local wiring and disposed over the second interlayer insulating film, wherein the dummy gate electrode is electrically independent from the 2-input NAND circuit and has a floating potential.

5. The semiconductor device according to claim 4, wherein the fourth local wiring is electrically independent from the 2-input NAND circuit and has a floating potential.

6. The semiconductor device according to claim 4, further comprising:

a plug electrode surrounded by the second interlayer insulating film in plan view and coupling the fourth local wiring with the first wiring.

7. The semiconductor device according to claim 4, wherein in the first direction a first distance between the first P gate electrode and the second P gate electrode is equal to a second distance between the second P gate electrode and the dummy gate electrode.

8. The semiconductor device according to claim 4, wherein in the first direction a third distance between the third local wiring and the first local wiring is equal to a fourth distance between the fourth local wiring and the third local wiring.

* * * * *